United States Patent
Chugg et al.

(10) Patent No.: US 7,958,425 B2
(45) Date of Patent: *Jun. 7, 2011

(54) METHOD AND APPARATUS FOR COMMUNICATIONS USING TURBO LIKE CODES

(75) Inventors: Keith Michael Chugg, La Canada, CA (US); Paul Kingsley Gray, San Diego, CA (US); Georgios Dimitrios Dimou, San Diego, CA (US); Phunsak Thiennviboon, San Diego, CA (US)

(73) Assignee: Trelliware Technologies, Inc., San Diego, CA (US)

( * ) Notice: Subject to any disclaimer, the term of this patent is extended or adjusted under 35 U.S.C. 154(b) by 993 days.

This patent is subject to a terminal disclaimer.

(21) Appl. No.: 11/060,081

(22) Filed: Feb. 16, 2005

(65) Prior Publication Data

US 2005/0216819 A1     Sep. 29, 2005

Related U.S. Application Data

(60) Provisional application No. 60/546,270, filed on Feb. 19, 2004.

(51) Int. Cl.
   *H03M 13/00*     (2006.01)
(52) U.S. Cl. ..................................................... 714/755
(58) Field of Classification Search .................... 714/755
   See application file for complete search history.

(56) References Cited

U.S. PATENT DOCUMENTS

| | | | | | |
|---|---|---|---|---|---|
| 4,713,817 A | * | 12/1987 | Wei | ................................ | 714/758 |
| 4,888,775 A | * | 12/1989 | Karabed et al. | ................ | 714/755 |
| 5,214,672 A | * | 5/1993 | Eyuboglu et al. | ............. | 375/254 |
| 5,392,299 A | | 2/1995 | Rhines et al. | | |
| 6,016,568 A | * | 1/2000 | Wolf et al. | ..................... | 714/792 |
| 6,023,783 A | | 2/2000 | Divsalar et al. | | |
| 6,029,264 A | | 2/2000 | Kobayashi et al. | | |
| 6,031,874 A | * | 2/2000 | Chennakeshu et al. | ........ | 375/262 |
| 6,081,919 A | * | 6/2000 | Fujiwara et al. | .............. | 714/755 |
| 6,166,667 A | | 12/2000 | Park | | |
| 6,202,189 B1 | * | 3/2001 | Hinedi et al. | ................. | 714/786 |
| 6,266,795 B1 | | 7/2001 | Wei | | |
| 6,289,486 B1 | | 9/2001 | Lee et al. | | |

(Continued)

OTHER PUBLICATIONS

Benedetto, S, Analysis, design, and Iterative decoding of double serially concatenated codes with interleavers, 1998, IEEE, vol. 16, pp. 232-242.*

(Continued)

*Primary Examiner* — Scott T Baderman
*Assistant Examiner* — Enam Ahmed
(74) *Attorney, Agent, or Firm* — Kilpatrick Townsend & Stockton LLP

(57) ABSTRACT

The present invention relates to methods, apparatuses, and systems for performing data encoding involving encoding data bits according to an outer convolutional code to produce outer encoded bits processing the outer encoded bits using an interleaver and a logical unit to produce intermediate bits, wherein the logical unit receives a first number of input bits and produces a second number of corresponding output bits, the second number being less than the first number, and wherein the logical unit takes each of the first number of input bits into account in producing the second number of output bits, encoding the intermediate bits according to an inner convolutional code to produce inner encoded bits, wherein the inner convolutional code is characterized by at least two states, and combining the data bits and the inner encoded bits to produce encoded outputs.

31 Claims, 12 Drawing Sheets

U.S. PATENT DOCUMENTS

| | | | |
|---|---|---|---|
| 6,351,832 | B1 | 2/2002 | Wei |
| 6,353,900 | B1 * | 3/2002 | Sindhushayana et al. .... 714/701 |
| 6,377,610 | B1 | 4/2002 | Hagenauer et al. |
| 6,473,878 | B1 | 10/2002 | Wei |
| 6,484,283 | B2 | 11/2002 | Stephen et al. |
| 6,625,775 | B1 | 9/2003 | Kim |
| 6,690,739 | B1 * | 2/2004 | Mui ............................. 375/265 |
| 7,010,051 | B2 | 3/2006 | Murayama et al. |
| 7,093,179 | B2 | 8/2006 | Shea |
| 7,185,260 | B2 * | 2/2007 | Coombs et al. ............... 714/755 |
| 7,673,213 | B2 | 3/2010 | Chugg et al. |
| 2002/0061071 | A1 * | 5/2002 | Cameron et al. ............. 375/295 |
| 2003/0221156 | A1 * | 11/2003 | Berger et al. ................. 714/755 |
| 2006/0031737 | A1 | 2/2006 | Chugg et al. |

OTHER PUBLICATIONS

Chugg, Keith M. A new Class of Turbo-Like Codes with Desirable Practical Properties, Comm. Theory Workshop May 6, 2004.

Flexicodes: A Highly Flexible FEC Solution. Whitepaper Trellisware Technologies. Inc. Apr. 6, 2004.

Aji, Srinivas M. et al., "The generalized distributive law", IEEE Transactions on Information Theory, 46(2):325-43, Mar. 2000.

Bahl, L.R. et al., "Optimal decoding of linear codes for minimizing symbol error rate", IEEE Transactions on Information Theory, Mar. 1974, pp. 284-287.

Gallager, R.G., "Low-density parity-check Codes", IRE Transactions on Information Theory, Jan. 1962, pp. 21-28.

Kschischang, Frank R. et al., "Factor graphs and the sum-product algorithm", IEEE Transactions on Information Theory, 47(2):498-519, Feb. 2001.

MacKay, D.J.C. et al., "Near Shannon limit performance of low density parity check codes", Electronics Letters, 32(18):1645-46, Aug. 29, 1996.

Richardson, Thomas J. et al., "Design of capacity-approaching irregular low-density parity-check codes", IEEE Transactions on Information Theory, 47(2):619-37, Feb. 2001.

Abbasfar et al."Accumulate repeat accumulate codes," proceedings of the IEEE International Symposium on Information Theory (ISIT), p. 505 (Jul. 2004).

Abbasfar et al."Accumulate repeat accumulate codes," proceedings of the IEEE Communications Society, Blobcon 2004, pp. 509-513 (Dec. 2004).

Chugg et. al. "A New Class of Turbo-like Codes with Universally Good Performance and High-Speed Decoding", Proc. IEEE Military Comm. Conf. (Oct. 2005).

Jin et al. "Irregular repeat accumulate codes," In Turbo Code Conf., Brest, France, (Sep. 2000).

Ping "The SPC technique and low complexity turbo codes," Proc. Globecom Conf., Rio de Janeiro, Brazil, pp. 2592-2596 (Dec. 1999).

U.S. Appl. No. 11/203,683, Office Action dated Oct. 8, 2008, 10 pages.

U.S. Appl. No. 11/203,683, Final Office Action dated Jan. 13, 2009, 20 pages.

U.S. Appl. No. 11/203,683, Office Action dated Aug. 26, 2009, 12 pages.

U.S. Appl. No. 11/203,683, Notice of Allowance dated Dec. 31, 2009, 4 pages.

* cited by examiner

METHOD AND APPARATUS FOR COMMUNICATIONS USING TURBO LIKE CODES

CROSS-REFERENCES TO RELATED APPLICATIONS

This application claims priority from U.S. Provisional Application No. 60/546,270; filed Feb. 19, 2004. The 60/546,270 application is incorporated herein by reference.

BACKGROUND OF THE INVENTION

Error correction codes have been widely used for transmission and/or storage of data in real world environments. Such environments may introduce noise, interference, and other effects that can deteriorate the quality of the data transmitted or stored, such that upon recovery, the data may contain errors. Generally speaking, error correction coding utilizes codes to add redundancy to the data transmitted or stored so that the redundancy can later be exploited to correct errors when the data is recovered.

Traditional forward error correction (FEC) codes have been commonly adopted as error correction codes in data transmission and storage systems. These traditional FEC codes include block codes and convolutional codes. Block codes generally involve an encoder that takes in blocks of k input bits and transform each block into n output bits. Such a code is thus referred to as a (n,k) block code. The rate of such a block code is typically defined as $r=k/n$.

Convolutional codes generally involve an encoder having a memory of M bits. Thus, a convolutional encoder may be viewed as having $2^M$ possible states. Each output bit of the convolutional encoder may be determined based on the memory of M bits and possibly one or more incoming bits. For example, an output bit may be generated by applying combinatorial logic to selected taps on the memory of M bits and one or more incoming bits. In other words, the output of a convolutional encoder may be determined based on the current state of the encoder and the incoming data. Also, more than one output bit may be generated in this manner each time new input bit(s) are shifted into the memory of M bits. The operation of a convolutional encoder may be represented by a trellis, as is well known in the art. The rate of a convolutional encoder that generates n output bits for every k input bits is typically defined as $r=k/n$.

There exists a variety of different block codes and convolutional codes. There also exists a variety of decoding algorithms for decoding the coded information in attempting to reconstruct the original data. For example, convolutional coding paired with Viterbi decoding is a popular FEC technique that is widely used in systems for transmitting data through channels affected by additive white Gaussian noise (AWGN).

Turbo codes and Turbo-like codes represent a relatively new and very powerful category of error correction codes. In the present disclosure, these codes and variations thereof are generally referred to as Turbo-like codes (TLC). A Turbo-like code generally involves the concatenation of two or more simple codes separated by an interleaver, combined with an iterative decoding strategy.

TLCs may provide significantly better coding gain compared to traditional FEC approaches. The coding gain may be as much as 3 decibels (dB) in many cases. That is, compared to a system using a traditional FEC code to achieve a certain performance level while operating at a particular noise level, a system using a TLC may be able to achieve the same performance level while operating at a noise level that is higher by 3 dB. The performance of such systems may be measured as bit error rate (BER), and the noise level may be measured as signal-to-noise ratio ($Eb/N_0$, expressed in dB), for instance.

FIG. 1 depicts a general curve of error probability performance versus signal-to-noise ratio that is characteristic of many TLCs. As shown, there is an initial steep reduction in error probability as $Eb/N_0$ is increased called the waterfall region, followed by a region of shallower reduction called the error floor region. The area where TLCs have traditionally excelled is in the waterfall region. Indeed, there exist TLCs that are within a small fraction of a dB of the Shannon limit in this region. However, many TLCs have an almost flat error floor region, or one that starts at a very high error rate, or both. This means that the coding gain of these TLCs rapidly diminishes as the target error rate is reduced. The performance of a TLC in the error floor region likely depends on many factors, such as the constituent code design and the interleaver design, but it typically worsens as the code rate increases or the frame size decreases. Thus many TLC designs only perform well at high error rates, or low code rates, or large frame sizes. Furthermore these designs often only target a single code rate, frame size, and modulation scheme, or suffer degraded performance or increased complexity to achieve flexibility in these areas.

A number of properties desirable in a Turbo-like code are described below. However, existing TLCs typically achieve only some of these desirable qualities, and do not consistently perform well in terms of these qualities across different environments.

Good threshold performance is desirable. That is, the waterfall region of a TLC's BER curve should occur at as low an $Eb/N_0$ as possible. This will minimize the energy expense of transmitting information. Good floor performance is also desirable. The error floor region of a TLC's BER curve should occur at a BER of as low as possible. For communication systems employing an automatic repeat-request (ARQ) scheme this may be as high as $10^{-6}$, while most broadcast communications systems demand $10^{-10}$ performance, and storage systems and optical fiber links require BERs as low as $10^{-15}$. Low complexity code constraints are desirable. To allow for low complexity decoders, particularly for high throughput applications, the constituent codes of the TLC should be simple. Furthermore, to allow the construction of high throughput decoders, the code structure should be such that parallel decoder architectures with simple routing and memory structures are possible. Fast decoder convergence is desirable. The decoder of a TLC code should converge rapidly (i.e. the number of iterations required to achieve most of the iteration gain should be low). This allows the construction of high throughput hardware decoders and/or low complexity software decoders. Code rate flexibility is also desirable. Most modern communications and storage systems do not operate at a single code rate. For example, in adaptive systems the code rate is adjusted according to the available SNR so that the code overheads are minimized. It should be possible to fine-tune the code rate to adapt to varying application requirements and channel conditions. Furthermore, this code rate flexibility should not come at the expense of degraded threshold or floor performance. Many systems demand code rates of 0.95 or above, which is typically very difficult to achieve for most TLCs. Frame size flexibility is desirable. Generally speaking the threshold and floor performance of TLCs are maximized by maximizing frame size. However, it is not always practical, for example, to have frames of many thousands of bits. Therefore it is desirable that a TLC still performs well with smaller frame size, as small as only one or two hundred bits for instance. Furthermore, modulation flexibility is desirable. In modern communication systems employing adaptive coding and modulation (ACM), for example, it is essential that the TLC easily support a broad range of modulation schemes.

Turbo-like codes (TLCs) include Parallel Concatenated Convolutional Codes (PCCC), which is often referred to as the classical Turbo code, Serially Concatenated Convolutional Codes (SCCC), Low Density Parity Check Codes (LDPC), and Turbo Product Codes (TPC). There have also been numerous variations on the basic TLC theme. FIGS. 2-5 present some basic encoder structures for these various TLCs. A brief description of different characteristics of each of these TLCs is provided below.

FIG. 2 is an illustrative block diagram of an encoder for a PCCC which involves the parallel concatenation of two convolutional codes. One encoder is fed the frame of information bits directly, while the other encoder is fed an interleaved version of the information bits. The encoded outputs of the two encoders are mapped to the signal set used on the channel. PCCCs generally have good threshold performance that is amongst the best threshold performance of all TLCs. However, PCCCs also generally have the worst floor performance of all TLCs. With 8-state constituent codes BER floors are typically in the range $10^{-6}$ to $10^{-8}$, but this can be reduced to the $10^{-8}$ to $10^{-10}$ range by using 16-state constituent codes. However, achieving floors below 10-10 may be difficult, particularly for high code rates and/or small frame sizes. There are PCCC variants that have improved floors, such as concatenating more than two constituent codes, but only at the expense of increased complexity. PCCCs have high complexity code constraints. With 8- or 16-state constituent codes the PCCC decoder complexity is rather high. PCCCs generally have fast convergence that is amongst the fastest of all TLCs. Typically only 4-8 iterations are required. PCCCs generally have fair code rate flexibility. Code rate flexibility is easily achieved by puncturing the outputs of the constituent codes, as is well known in the art. However, for very high code rates the amount of puncturing required is rather high, which degrades performance and increases decoder complexity. PCCCs have good frame size flexibility. The frame size may be modified by changing the size of the interleaver, and there exist many flexible interleaver algorithms that achieve good performance. PCCCs generally have good modulation flexibility. Systematic bits and the parity bits from each constituent code generally need to combined and mapped to the signal set.

FIG. 3 is an illustrative block diagram of an encoder for a SCCC which involves the serial concatenation of two convolutional codes. The outer encoder is fed the frame of information bits, and its encoded output is interleaved before being input to the inner encoder. The encoded outputs of only the inner encoder must be mapped to the signal set used on the channel. SCCCs generally have medium threshold performance. The threshold performance of SCCCs is typically 0.3 dB worse than PCCCs. SCCCs generally have good floor performance that is amongst the best of all TLCs. With SCCCs, it is possible to have BER floors in the range $10^{-8}$ to $10^{-10}$ with 4-state constituent codes, and below $10^{-10}$ with 8-state constituent codes. However floor performance is degraded with high code rates. SCCCs generally have medium complexity code constraints. Code complexity constraints are typically low, but are higher for high code rates. Also, constituent decoder complexity is higher than for the equivalent code in a PCCC because soft decisions of both systematic and parity bits must be formed. SCCCs generally have fast convergence. The convergence may be even faster than that of PCCCs, typically with 4-6 iterations required. However, SCCCs have poor code rate flexibility. As in the case of PCCCs, SCCCs typically accomplish rate flexibility by puncturing the outputs of the constituent encoders. However, due to the serial concatenation of constituent codes, the amount of puncturing is typically required to be higher for SCCCs than for PCCCs, for an equivalent overall code rate. SCCCs generally have good frame size flexibility. As in the case of PCCCs, SCCCs accomplish frame size flexibility by changing the size of the interleaver. However, for equivalent information frame sizes the interleaver of an SCCC is generally larger than that of a PCCC. Consequently, there is a complexity penalty in SCCCs for large frame sizes. Also, if the code rate is adjusted by puncturing the outer code then the interleaver size will depend on both the code rate and frame size, which complicates reconfigurability. Finally, SCCCs generally have very good modulation flexibility. This is because the inner code on an SCCC is connected directly to the channel it is relatively simple to map the bits into the signal set.

FIG. 4 is an illustrative block diagram of an encoder for a LDPC which involves block codes defined by a sparse parity check matrix. This sparseness admits a low complexity iterative decoding algorithm. The generator matrix corresponding to this parity check matrix can be determined, and used to encode a frame of information bits. These encoded bits must then be mapped to the signal set used on the channel, as shown in FIG. 4. LDPCs generally have good threshold performance. LDPCs have been reported that have threshold performance within a tiny fraction of a dB of the Shannon Limit. However, for practical decoders their threshold performance is usually comparable to that of PCCCs. LDPCs generally have medium floor performance. Floor performance for LDPCs are typically better than PCCCs, but worse than SCCCs. LDPCs generally have low complexity code constraints. In fact, LDPCs typically have the lowest complexity code constraints of all TLCs. However, high throughput LDPC decoders require large routing resources or inefficient memory architectures, which may dominate decoder complexity. Also, LPDC encoders are typically a lot more complex than other TLC encoders. LDPCs generally have slow convergence. LDPC decoders typically have the slowest convergence of all TLCs. Many published results are for 100 iterations or more. However, practical LDPC decoders will typically use 20-30 iterations. LDPCs generally have good code rate flexibility. However, LDPCs generally have poor frame size flexibility. For LDPCs to change frame size, they must change their parity check matrix, which may be quite difficult in a practical, high throughput decoder. LDPCs generally have good modulation flexibility. As in the case of PCCCs, output bits of LDPCs generally need to be mapped into signal sets of a modulation scheme.

FIG. 5 is an illustrative block diagram of an encoder for a TPC involving the arrangement of information bits as an array of equal length rows and equal length columns. The rows are encoded by one block code, and then the columns (including the parity bits generated by the first encoding) are encoded by a second block code. The encoded bits must then be mapped into the signal set of the channel. TPCs generally have poor threshold performance. In fact, TPCs typically have the worst threshold performance of all TLCs. TPCs can have thresholds that are as much as 1 dB worse than PCCCs. However, for very high code rates, e.g., 0.95 and above, they will typically outperform other TLCs. TPCs have medium floor performance. The floor performance of TPC is typically lower than that of PCCCs, but not as low as that of SCCCs. TPCs generally have low complexity code constraints. TPC decoders typically have the lowest complexity of all TLCs, and high throughput parallel decoders can readily be constructed. TPCs generally have medium convergence. TPC decoders typically require 8-16 iterations to converge. However, TPCs generally have poor rate flexibility. The overall rate of a TPC is typically dictated by the rate of its constituent codes. There is some flexibility available in these rates, but it is often very difficult to choose an arbitrary rate. TPCs also generally have poor frame size flexibility. The overall frame size of a TPC is also typically dictated by the frame size of its constituent codes. It is often difficult to choose an arbitrary frame size, and especially difficult to choose an arbitrary code rate and an arbitrary frame size. Finally, TPCs generally have good modulation flexibility. As in the case of PCCCs and LDPCs, output bits of TPCs generally need to be mapped into signal sets of a modulation scheme.

In the various TLCs described above, lack of flexibility is typically a serious concern. That is, high levels of performance is usually only achieved for a limited range of code rates, frame sizes, or modulation types. Operation outside of this limited range results in degraded performance or significantly increased complexity. Furthermore, it is more difficult to achieve high data throughputs with Turbo-like code decoders compared to decoders for more traditional FEC schemes. There is a demand in modern communication and storage systems for a very flexible error correction solution that does not compromise performance and can achieve high data throughputs.

BRIEF SUMMARY OF THE INVENTION

The present invention relates to methods, apparatuses, and systems for performing data encoding involving encoding data bits according to an outer convolutional code to produce outer encoded bits processing the outer encoded bits using an interleaver and a logical unit to produce intermediate bits, wherein the logical unit receives a first number of input bits and produces a second number of corresponding output bits, the second number being less than the first number, and wherein the logical unit takes each of the first number of input bits into account in producing the second number of output bits, encoding the intermediate bits according to an inner convolutional code to produce inner encoded bits, wherein the inner convolutional code is characterized by at least two states, and combining the data bits and the inner encoded bits to produce encoded outputs.

The logical unit may perform a single parity check, and may be implemented as an XOR circuit. In one embodiment of the invention, the outer encoded bits are processed by the interleaver to generate interleaved bits, and the interleaved bits are processed by the logical unit to produce the intermediate bits. The encoded outputs may represent symbols mapped according to a modulation scheme. The encoded outputs may represent a plurality of bits. The first number may be variable to allow change in an overall coding rate. The second number may have a fixed value of 1.

According to one embodiment of the invention, the inner convolutional code is associated with a time-varying trellis, is characterized by four states, and is a rate 1/1 code. In one embodiment of the invention, the outer convolutional code is associated with a time-varying trellis, is characterized by four states, and is a rate 1/2 code.

The present invention also relates to methods, apparatuses, and systems for performing data decoding involving obtaining soft channel metrics derived from a channel, decoding the soft channel metrics using an outer soft-input-soft-output (SISO) decoder, an inner SISO decoder, a logical unit SISO decoder, an interleaver, and a de-interleaver to produce decoded soft outputs, wherein the logical unit SISO decoder in one direction receives a first number of soft inputs and produces a corresponding second number of soft outputs, the second number being less than the first number, and wherein the logical unit SISO decoder in another direction receives the second number of soft inputs and produces a corresponding first number of soft outputs.

The logical unit SISO decoder may correspond to an encoder logical unit that receives the first number of input bits and produces the second number of corresponding output bits, wherein the encoder logical unit takes each of the first number of input bits into account in producing the second number of output bits. The logical unit SISO decoder may perform a single parity check decoding operation. The first number may be variable to allow change in an overall coding rate. The second number may have a fixed value of 1. Further, the decoded soft outputs may be hard limited to produce decoded bits.

DETAILED DESCRIPTION OF THE INVENTION

Encoder

Figure 1:
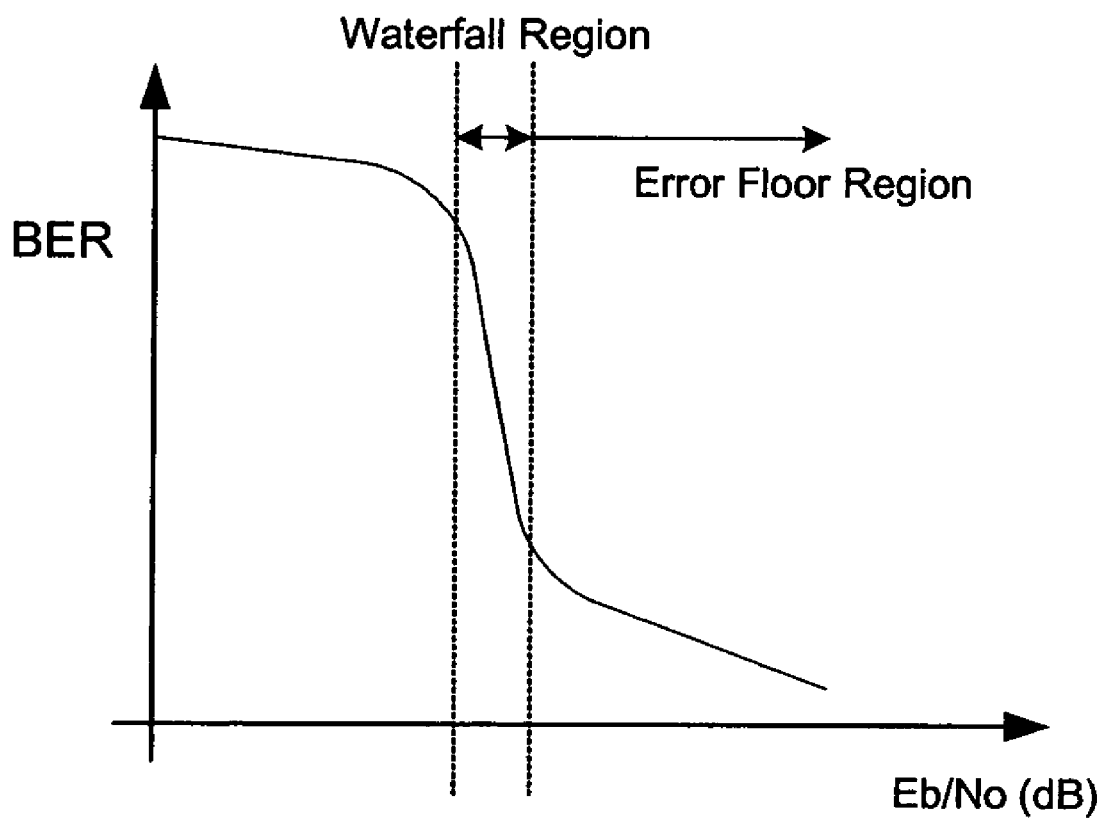
FIG. 1 depicts a general curve of error probability performance versus signal-to-noise ratio that is characteristic of many TLCs.
Figure 2:
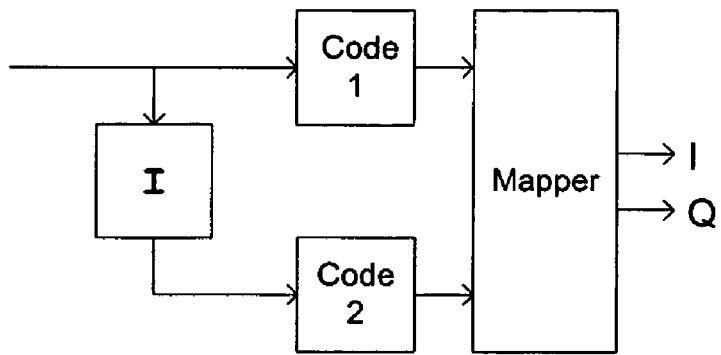
FIG. 2 is an illustrative block diagram of an encoder for a PCCC which involves the parallel concatenation of two convolutional codes.
Figure 3:
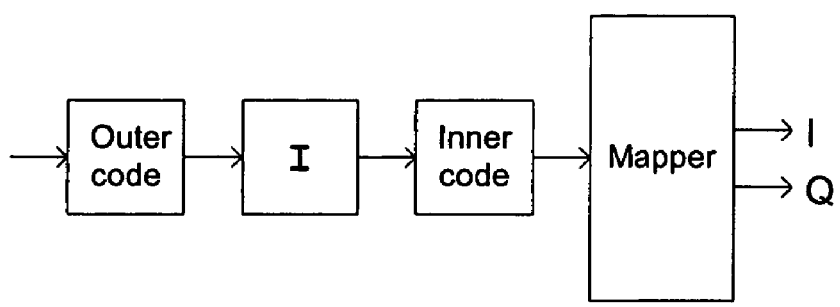
FIG. 3 is an illustrative block diagram of an encoder for a SCCC which involves the serial concatenation of two convolutional codes.
Figure 4:
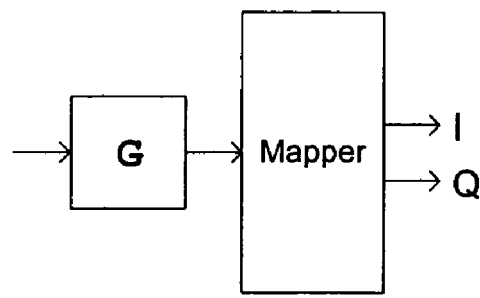
FIG. 4 is an illustrative block diagram of an encoder for a LDPC which involves block codes defined by a sparse parity check matrix.
Figure 5:
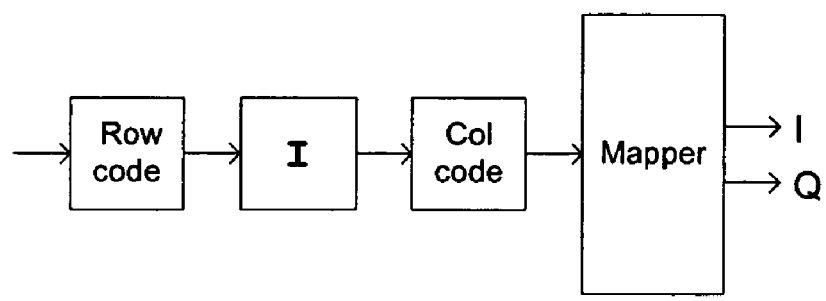
FIG. 5 is an illustrative block diagram of an encoder for a TPC involving the arrangement of information bits as an array of equal length rows and equal length columns.
Figure 6:
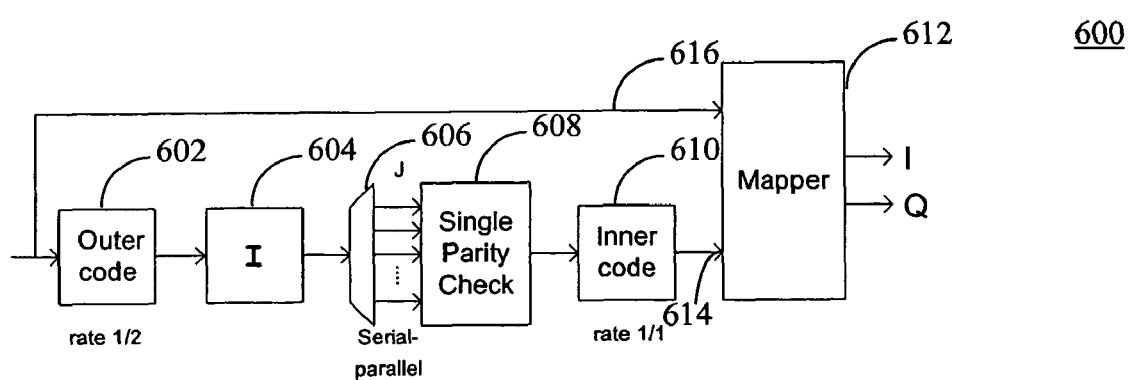
FIG. 6 is an illustrative block diagram of an encoder 600 for an improved error correction coding scheme according to one embodiment of the present invention.

FIG. 6 is an illustrative block diagram of an encoder 600 for an improved error correction coding scheme according to one embodiment of the present invention. Here, encoder 600 comprises an outer code module 602, an interleaver 604, a serial to parallel converter 606, a single parity check (SPC) module 608, an inner code module 610, and a mapper 612. As shown in the figure, encoder 600 generates a systematic code. In other words, both the encoded bits generated from the input bits, as well as the input bits themselves, are sent through the channel. The channel as described here broadly refers to a medium of data transmission or data storage that potentially introduces errors in the data.

As shown in the figure, input bits are first encoded by outer code module 602. In this example, outer code module 602 implements a rate 1/2 convolutional code with a time-varying trellis. In other words, the trellis that represents the behavior of this convolutional encoder has a structure that can vary with time. For example, such a trellis can change from one structure to another structure each time one or more input bits are processed. These different structures are referred to here as trellis sections. A time-varying trellis may change its structure, from a first trellis section, to a second trellis section, to a third trellis section, and so on, until it reaches an $N^{th}$ trellis section. The trellis may then change back to the first trellis section and repeat through the same set of trellis sections. Such a set of trellis sections is referred to here as a trellis pattern. Details of the operation of time-varying trellises are known in the art. Referring back to FIG. 6, the trellis sections that make up the trellis pattern associated with outer code module 602 can be mixed and matched to form different trellis patterns, in order optimize threshold performance, floor performance, and/or other criteria.

In one embodiment, output code module 602 represents a 4-state outer code. In another embodiment, a 2-state outer code is used, which may be less complex but may be associated with higher floors. In yet another embodiment, an 8-state outer code is used, which may be more complex but may be associated with lower floors. The number of states of the outer code may thus vary and may be chosen to optimize performance. For example, a 4-state outer code may provide a desirable balance between floor height and complexity, and may provide a floor below a BER of $10^{-10}$ in certain implementations.

According to one embodiment of the invention, interleaver 604 interleaves the results of outer code module 602. As shown, outer code module 602 has a serial output, and interleaver 604 has a serial input as well. Thus, no serial-to-parallel or parallel-to-serial conversion is necessary. This may not always be the case in other implementations. For example, if outer code module 602 has a parallel output, and interleaver 604 has a serial input, a parallel-to-serial conversion unit (not shown) may be used to convert the data from parallel form to serial form, before being supplied to interleaver 604. Other variations may be possible, and appropriate serial-to-parallel or parallel-to-serial conversions may be utilized, as is known in the art.

According to one embodiment of the invention, if the outer code rate is 1/2, the length of interleaver 604 may be 2K bits, where K is the size of the input data frame in bits. In other works, for every K input bits, outer code module 602 may generate 2K encoded bits, and interleaver 604 may perform interleaving based on a length of 2K bits. In the present embodiment of the invention, encoder 600 allows K to be a programmable value, as opposed to a fixed value. Accordingly, interleaver 606 may be a variable length interleaver. Different designs of variable length interleavers are well known in the art.

Serial to parallel converter 606 transforms the output of interleaver 604 from serial form to parallel form. Specifically, the bits from interleaver 604 are grouped into groups of J bits. Here, K and J may be different values. However, it is possible in certain implementations that K and J may be the same value. The output of serial to parallel converter 606 is provided to single parity check module 608.

Single parity check (SPC) module 608 receives the groups of J bits and outputs a single bit for each group of J bits. In the present embodiment of the invention, the single bit is generated as the modulo-2 sum of the J bits. For example, the single bit may be implemented in combinatorial logic as the exclusive OR (XOR) of the J bits. Thus, the single bit takes into account each of the J bits from which it is generated. In the present embodiment of the invention, encoder 600 allows J to be a programmable value, as opposed to a fixed value. As can be seen from FIG. 6, the overall coding rate of encoder 600 may be expressed as J/(J+2).

By varying the value of J, encoder 600 can be configured to produce a wide variety of coding rates. Importantly, this rate flexibility is achieved while desirable code performance is maintained. By contrast, for instance, an SCCC code offers rate flexibility at a cost of decreased code performance. An SCCC code utilizes a puncture circuit to achieve rate flexibility. Such a puncture circuit keeps one bit out of every J bits and discards the rest of the bits. The SPC circuit utilized in accordance with the present embodiment of the invention combines J bits to produce one bit and achieves superior results in terms of a larger minimum distance and lower floors.

Inner code module 610 encodes the data received from SPC module 608. In this example, inner code module 610 implements a rate 1/1 convolutional code with a time varying trellis. Again, the trellis sections of this code can be mixed and matched to optimize threshold performance, floor performance, and/or other criteria. In one embodiment, inner code module 610 represents a 4-state inner code. In another embodiment, a 2-state inner code is be used, which may be less complex but may be associated with higher floors. In yet another embodiment, an 8-state inner code is used, which may be more complex but may be associated with lower floors. The number of states of the outer code may thus vary and may be chosen to optimize performance. For example, a 4-state inner code may provide a desirable balance between floor height and complexity, and may provide a floor below a BER of $10^{-10}$ in certain implementations. Here, the inner code needs to only operate once for every J/2 times the outer code operates, which reduces complexity.

Mapper 612 receives the output of inner code module 610, which may be referred to as "parity" data. Mapper 612 also receives the original input data, which may be referred to as "systematic" data. Here, mapper 612 represents a flexible mapper circuit that can take the parity data stream 614 and systematic data stream 616 and map them into a format suitable for sending through the channel. In one embodiment of the invention, mapper 612 selectively applies Gray code mapping and generates different types of modulation signals based on the parity and systematic data streams. For example, the modulations signals may include binary phase shift keying (BPSK), quadrature phase shift keying (QPSK), 8-ary phase shift keying (8PSK), 16 quadrature amplitude modulation (16 QAM), and 16 amplitude and phase shift keying (16 APSK). As is known in the art, other types of modulation and variations thereof may also be used.

Specific Example of Encoder

Below is a detailed description of a specific example of an encoder that flexibly performs encoding for different data frame sizes, coding rates, and modulations, in accordance with one embodiment of the invention. The structure presented previously as encoder 600 is utilized again for illustrative purposes. Here, the encoder may operate with eight default frame sizes ranging from 128 bits to 16384 bits, as listed below. Each data frame refers to a collection of data organized as a group for processing.

128 bits;
256 bits;
512 bits;
1024 bits;
2048 bits;
4096 bits;
8192 bits; and
16384 bits.

These data frame sizes are presented for illustrative purpose. Other sizes may also be adopted. In accordance with one embodiment of the invention, the encoder may be reprogrammed to support different sets of frame sizes. For example, the encoder may be reprogrammed to support another set of eight different frame sizes. Also, the encoder may allow the frame size to be selected from the available sizes on a frame-by-frame basis.

Here, the encoder supports eight different code rates, as listed below. These code rates are presented for illustrative purposes. Other code rates may also be used in accordance with the present invention. The encoder may also allow the code rate to be selectable on a frame-by-frame basis.

1/2;
2/3;
3/4;
4/5;
5/6;
7/8;
8/9; and
19/20.

The encoder may optionally output a coded bit stream directly, or map the bit stream onto user specified modulation symbols. The possible mappings in this example are:

BPSK;
QPSK;
8PSK;
16QAM; and
16 APSK

These mappings are presented for illustrative purposes. Other mappings may also be adopted in accordance with the invention. In one embodiment, other mappings may be supported by using BPSK or QPSK mode and performing the mapping externally.

Referring back to FIG. 6, encoder 600 may utilize an outer code module 602 that implements a rate 2/4 4-state convolutional code with a time varying trellis. There are K input bits to the outer encoder, and 2K output bits. The input bits are considered as pairs of bits and are labeled $\{b_0^1 b_0^2 b_1^1 b_1^2 \ldots b_k^1 b_k^2 \ldots b_{K/2-1}^1 b_{K/2-1}^2\}$. The output bits are considered as quadruples of 4 bits and are labeled $\{c_0^1 c_0^2 c_0^3 c_0^4 c_1^1 c_1^2 c_1^3 c_1^4 \ldots c_k^1 c_k^2 c_k^3 c_k^4 \ldots c_{K/2-1}^1 c_{K/2-1}^2 c_{K/2-1}^3 c_{K/2-1}^4\}$. The first bit in each set corresponds to the earliest bit in time.

Outer code module 602 utilizes a time-vary trellis. There are 15 different trellis sections used in the outer code, each corresponding to a pair of input bits, and these are described in Table 1 to Table 15. In these tables all combinations of current state and input pairs are given, along with the corresponding output quadruple and next state.

TABLE 1

Outer Trellis Section Number 0

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 0100 | 0 |
| 1 | 10 | 1000 | 1 |
| 1 | 01 | 0111 | 2 |
| 1 | 11 | 1011 | 3 |
| 2 | 00 | 0001 | 0 |
| 2 | 10 | 1101 | 1 |
| 2 | 01 | 0010 | 2 |
| 2 | 11 | 1110 | 3 |
| 3 | 00 | 0101 | 0 |
| 3 | 10 | 1001 | 1 |
| 3 | 01 | 0110 | 2 |
| 3 | 11 | 1010 | 3 |

TABLE 2

Outer Trellis Section Number 1

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0001 | 0 |
| 2 | 10 | 1100 | 1 |
| 2 | 01 | 0010 | 2 |
| 2 | 11 | 1111 | 3 |
| 3 | 00 | 0101 | 0 |
| 3 | 10 | 1000 | 1 |
| 3 | 01 | 0110 | 2 |
| 3 | 11 | 1011 | 3 |

TABLE 3

Outer Trellis Section Number 2

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |

TABLE 3-continued

Outer Trellis Section Number 2

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 1 | 10 | 1001 | 1 |
| 1 | 01 | 0111 | 2 |
| 1 | 11 | 1010 | 3 |
| 2 | 00 | 0011 | 0 |
| 2 | 10 | 1110 | 1 |
| 2 | 01 | 0000 | 2 |
| 2 | 11 | 1101 | 3 |
| 3 | 00 | 0111 | 0 |
| 3 | 10 | 1010 | 1 |
| 3 | 01 | 0100 | 2 |
| 3 | 11 | 1001 | 3 |

TABLE 4

Outer Trellis Section Number 3

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 0100 | 0 |
| 1 | 10 | 1000 | 1 |
| 1 | 01 | 0111 | 2 |
| 1 | 11 | 1011 | 3 |
| 2 | 00 | 0101 | 0 |
| 2 | 10 | 1001 | 1 |
| 2 | 01 | 0110 | 2 |
| 2 | 11 | 1010 | 3 |
| 3 | 00 | 0001 | 0 |
| 3 | 10 | 1101 | 1 |
| 3 | 01 | 0010 | 2 |
| 3 | 11 | 1110 | 3 |

TABLE 5

Outer Trellis Section Number 4

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0101 | 0 |
| 2 | 10 | 1000 | 1 |
| 2 | 01 | 0110 | 2 |
| 2 | 11 | 1011 | 3 |
| 3 | 00 | 0001 | 0 |
| 3 | 10 | 1100 | 1 |
| 3 | 01 | 0010 | 2 |
| 3 | 11 | 1111 | 3 |

TABLE 6

Outer Trellis Section Number 5

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |

TABLE 6-continued

Outer Trellis Section Number 5

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0111 | 0 |
| 2 | 10 | 1010 | 1 |
| 2 | 01 | 0100 | 2 |
| 2 | 11 | 1001 | 3 |
| 3 | 00 | 0011 | 0 |
| 3 | 10 | 1110 | 1 |
| 3 | 01 | 0000 | 2 |
| 3 | 11 | 1101 | 3 |

TABLE 7

Outer Trellis Section Number 6

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 1100 | 0 |
| 1 | 10 | 0000 | 1 |
| 1 | 01 | 1111 | 2 |
| 1 | 11 | 0011 | 3 |
| 2 | 00 | 0101 | 0 |
| 2 | 10 | 1001 | 1 |
| 2 | 01 | 0110 | 2 |
| 2 | 11 | 1010 | 3 |
| 3 | 00 | 1001 | 0 |
| 3 | 10 | 0101 | 1 |
| 3 | 01 | 1010 | 2 |
| 3 | 11 | 0110 | 3 |

TABLE 8

Outer Trellis Section Number 7

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 1100 | 0 |
| 1 | 10 | 0001 | 1 |
| 1 | 01 | 1111 | 2 |
| 1 | 11 | 0010 | 3 |
| 2 | 00 | 0101 | 0 |
| 2 | 10 | 1000 | 1 |
| 2 | 01 | 0110 | 2 |
| 2 | 11 | 1011 | 3 |
| 3 | 00 | 1001 | 0 |
| 3 | 10 | 0100 | 1 |
| 3 | 01 | 1010 | 2 |
| 3 | 11 | 0111 | 3 |

TABLE 9

Outer Trellis Section Number 8

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 1100 | 0 |
| 1 | 10 | 0001 | 1 |
| 1 | 01 | 1111 | 2 |
| 1 | 11 | 0010 | 3 |
| 2 | 00 | 0111 | 0 |
| 2 | 10 | 1010 | 1 |
| 2 | 01 | 0100 | 2 |
| 2 | 11 | 1001 | 3 |
| 3 | 00 | 1011 | 0 |
| 3 | 10 | 0110 | 1 |
| 3 | 01 | 1000 | 2 |
| 3 | 11 | 0101 | 3 |

TABLE 10

Outer Trellis Section Number 9

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1110 | 1 |
| 0 | 01 | 0001 | 2 |
| 0 | 11 | 1111 | 3 |
| 1 | 00 | 0110 | 0 |
| 1 | 10 | 1000 | 1 |
| 1 | 01 | 0111 | 2 |
| 1 | 11 | 1001 | 3 |
| 2 | 00 | 0010 | 0 |
| 2 | 10 | 1100 | 1 |
| 2 | 01 | 0011 | 2 |
| 2 | 11 | 1101 | 3 |
| 3 | 00 | 0100 | 0 |
| 3 | 10 | 1010 | 1 |
| 3 | 01 | 0101 | 2 |
| 3 | 11 | 1011 | 3 |

TABLE 11

Outer Trellis Section Number A

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1110 | 1 |
| 0 | 01 | 0001 | 2 |
| 0 | 11 | 1111 | 3 |
| 1 | 00 | 0110 | 0 |
| 1 | 10 | 1000 | 1 |
| 1 | 01 | 0111 | 2 |
| 1 | 11 | 1001 | 3 |
| 2 | 00 | 0011 | 0 |
| 2 | 10 | 1101 | 1 |
| 2 | 01 | 0010 | 2 |
| 2 | 11 | 1100 | 3 |
| 3 | 00 | 0101 | 0 |
| 3 | 10 | 1011 | 1 |
| 3 | 01 | 0100 | 2 |
| 3 | 11 | 1010 | 3 |

TABLE 12

Outer Trellis Section Number B

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1111 | 1 |
| 0 | 01 | 0001 | 2 |
| 0 | 11 | 1110 | 3 |
| 1 | 00 | 0110 | 0 |
| 1 | 10 | 1001 | 1 |
| 1 | 01 | 0111 | 2 |
| 1 | 11 | 1000 | 3 |
| 2 | 00 | 0011 | 0 |
| 2 | 10 | 1100 | 1 |
| 2 | 01 | 0010 | 2 |
| 2 | 11 | 1101 | 3 |
| 3 | 00 | 0101 | 0 |
| 3 | 10 | 1010 | 1 |
| 3 | 01 | 0100 | 2 |
| 3 | 11 | 1011 | 3 |

TABLE 13

Outer Trellis Section Number C

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 0000 | 0 |
| 1 | 10 | 1001 | 1 |
| 1 | 01 | 0111 | 2 |
| 1 | 11 | 1110 | 3 |
| 2 | 00 | 0011 | 0 |
| 2 | 10 | 1010 | 1 |
| 2 | 01 | 0100 | 2 |
| 2 | 11 | 1101 | 3 |
| 3 | 00 | 0011 | 0 |
| 3 | 10 | 1010 | 1 |
| 3 | 01 | 0100 | 2 |
| 3 | 11 | 1101 | 3 |

TABLE 14

Outer Trellis Section Number D

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 1000 | 0 |
| 1 | 10 | 0001 | 1 |
| 1 | 01 | 1111 | 2 |
| 1 | 11 | 0110 | 3 |
| 2 | 00 | 0011 | 0 |
| 2 | 10 | 1010 | 1 |
| 2 | 01 | 0100 | 2 |
| 2 | 11 | 1101 | 3 |
| 3 | 00 | 1011 | 0 |
| 3 | 10 | 0010 | 1 |
| 3 | 01 | 1100 | 2 |
| 3 | 11 | 0101 | 3 |

TABLE 15

Outer Trellis Section Number E

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 1000 | 0 |
| 1 | 10 | 0001 | 1 |
| 1 | 01 | 1111 | 2 |
| 1 | 11 | 0110 | 3 |
| 2 | 00 | 1011 | 0 |
| 2 | 10 | 0010 | 1 |
| 2 | 01 | 1100 | 2 |
| 2 | 11 | 0101 | 3 |
| 3 | 00 | 0011 | 0 |
| 3 | 10 | 1010 | 1 |
| 3 | 01 | 0100 | 2 |
| 3 | 11 | 1101 | 3 |

In the present example, these trellis sections are combined together in 16 different trellis patterns, each consisting of 16 trellis sections. The 16 default trellis patterns are shown Table 16. According to one embodiment of the invention, encoder 600 allows these trellis patterns to be reprogrammed. The first trellis section in each trellis pattern is used as the first trellis section in frame, followed by the second trellis section, and so on. The different trellis patterns offer different trade-offs in terms of performance, such as in terms of threshold performance and floor performance. In this particular example, Trellis pattern number 0 likely provides the best threshold performance but the worst floor performance. As the trellis pattern number increases the threshold performance tends to worsen and the floor performance tends to improve. Trellis pattern number 15 likely provides the worst threshold performance but the best floor performance.

TABLE 16

Outer Trellis Patterns

| Trellis Pattern Number | Trellis Pattern |
|---|---|
| 0 | CBCBCBCBCBCBCBCB |
| 1 | 4444444444444444 |
| 2 | 1111111111111111 |
| 3 | 3030303030303030 |
| 4 | 0000000000000000 |
| 5 | 7777777777777777 |
| 6 | 0600060006000600 |
| 7 | 2020202020202020 |
| 8 | 2200220022002200 |
| 9 | 0222022202220222 |
| 10 | 2222222222222222 |
| 11 | 5858585858585858 |
| 12 | 2828282828282828 |
| 13 | 8588858885888588 |
| 14 | 8288828882888288 |
| 15 | 8888888888888888 |

Default outer encoder trellis patterns for each mode are shown in Table 17 to Table 20. As mentioned previously, encoder 600 may allow these trellis patterns to be reprogrammed. The default trellis patterns shown in Table 17 to Table 20 have been selected to provide superior threshold performance with a floor below a BER of $10^{-10}$.

TABLE 17

Outer Trellis Patterns for BPSK/QPSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 11 | 12 | 13 | 11 | 14 | 14 | 14 | 14 |
| 256 | 14 | 12 | 11 | 12 | 14 | 14 | 14 | 14 |
| 512 | 14 | 12 | 11 | 12 | 14 | 14 | 14 | 14 |
| 1024 | 12 | 10 | 10 | 13 | 14 | 15 | 15 | 15 |
| 2048 | 11 | 6 | 13 | 10 | 14 | 15 | 15 | 15 |
| 4096 | 7 | 5 | 7 | 7 | 11 | 10 | 10 | 15 |
| 8192 | 3 | 2 | 6 | 7 | 10 | 13 | 15 | 15 |
| 16384 | 7 | 3 | 8 | 6 | 9 | 11 | 12 | 14 |

TABLE 18

Outer Trellis Patterns for 8PSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 14 | 11 | 13 | 12 | 14 | 14 | 14 | 14 |
| 256 | 14 | 12 | 12 | 11 | 12 | 14 | 14 | 14 |
| 512 | 14 | 12 | 12 | 11 | 14 | 14 | 14 | 14 |
| 1024 | 11 | 8 | 10 | 7 | 14 | 14 | 15 | 15 |
| 2048 | 13 | 6 | 9 | 11 | 14 | 14 | 15 | 15 |
| 4096 | 8 | 8 | 8 | 11 | 11 | 12 | 13 | 15 |
| 8192 | 3 | 3 | 7 | 9 | 10 | 13 | 15 | 15 |
| 16384 | 4 | 3 | 4 | 6 | 9 | 10 | 12 | 15 |

TABLE 19

Outer Trellis Patterns for 16QAM

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 14 | 14 | 14 | 14 | 11 | 11 | 11 | 8 |
| 256 | 14 | 12 | 12 | 13 | 14 | 14 | 14 | 14 |
| 512 | 14 | 12 | 12 | 11 | 11 | 14 | 14 | 14 |
| 1024 | 11 | 6 | 10 | 8 | 14 | 13 | 14 | 15 |
| 2048 | 13 | 9 | 11 | 13 | 14 | 15 | 15 | 15 |
| 4096 | 7 | 6 | 4 | 6 | 11 | 11 | 11 | 15 |
| 8192 | 7 | 3 | 6 | 9 | 11 | 11 | 15 | 15 |
| 16384 | 7 | 2 | 5 | 6 | 9 | 8 | 9 | 12 |

TABLE 20

Outer Trellis Patterns for 16APSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 13 | 11 | 13 | 8 | 11 | 11 | 11 | 8 |
| 256 | 14 | 12 | 12 | 14 | 14 | 14 | 14 | 14 |
| 512 | 14 | 12 | 12 | 13 | 14 | 14 | 13 | 14 |
| 1024 | 11 | 6 | 11 | 13 | 13 | 14 | 14 | 15 |
| 2048 | 13 | 11 | 9 | 13 | 14 | 15 | 15 | 15 |
| 4096 | 8 | 4 | 6 | 4 | 9 | 11 | 14 | 15 |
| 8192 | 7 | 3 | 7 | 8 | 9 | 11 | 15 | 15 |
| 16384 | 7 | 3 | 7 | 6 | 9 | 12 | 12 | 15 |

According to one embodiment, tail biting termination is used in the outer encoder. Specifically, the first two bits of the frame are used to initialize the encoder state: $S_0 = 2b_0^2 + b_0^1$. Nothing is output during this time and these first two bits are stored. Then, once the end of the frame is reached, the first two bits are again input into the encoder and outputs generated. This returns the encoder to the same state as the initial state.

Referring again to FIG. 6, interleaver 604 performs interleaving on the output of outer code module 602. In this example, the interleaver block length is twice the data frame size. According to one embodiment of the invention, the interleaver block length is programmable, and the interleaver uses a Dithered Relative Prime (DRP) algorithm, which is well known. Here, the inputs to the interleaver are divided into groups of 64 bits, and the bits in each group are permuted within the group using the same permutation for each group (referred to as the input dither). If $v_{in}$ is a vector that represents the bits input to the interleaver ($v_{in}(i)$ is the ith bit into the interleaver) then the output of the input dither circuit is:

$$v_a(i) = v_{in}(I_a(i)),$$

where $$I_a(i) = 64 \lfloor i/64 \rfloor + r(i \bmod 64).$$

$r(i)$ is the input dither pattern and is defined in Table 21. Here, the input dither pattern is the same for all modes. Bits at the output of the input dither circuit are interleaved in a relative prime fashion. The output of the relative prime interleaver circuit is:

$$v_b(i) = v_a(I_b(i))$$

where $$I_b(i) = (s + ip) \bmod (2K)$$

and K is the number of information bits in the frame. The default relative prime interleaver parameters are varied according to the frame size, and are given in Table 22. According to one embodiment of the invention, encoder 600 allows the prime interleaver parameters to be reprogrammed. The output bits of the relative prime interleaver are again grouped into groups of 64 bits and permuted according to the output dither. The output of the output dither circuit, which may be the final output of the interleaver circuit, is:

$$v_{out}(i) = v_b(I_c(i))$$

where $$I_c(i) = 64 \lfloor i/64 \rfloor + w(i \bmod 64)$$

$w(i)$ is the output dither pattern and is varied according to the frame size. The output dither pattern is defined in Table 21.

TABLE 21

Input and Output Dither Patterns

| K | Dither | Pattern |
|---|---|---|
| All | r | (42, 34, 55, 47, 15, 7, 10, 50, 21, 63, 22, 26, 3, 40, 14, 38, 4, 39, 60, 32, 11, 57, 56, 18, 44, 54, 23, 58, 1, 12, 62, 31, 29, 48, 28, 13, 41, 52, 53, 33, 43, 20, 17, 36, 27, 35, 30, 5, 6, 46, 37, 45, 9, 24, 59, 8, 25, 19, 49, 61, 16, 2, 0, 51) |
| 128 | w | (38, 60, 59, 0, 40, 25, 29, 26, 9, 24, 1, 42, 37, 13, 62, 49, 3, 30, 23, 45, 36, 32, 18, 8, 50, 51, 5, 47, 31, 53, 21, 4, 58, 17, 6, 43, 14, 19, 12, 41, 7, 34, 63, 11, 55, 44, 35, 27, 54, 28, 20, 46, 61, 57, 2, 39, 56, 33, 22, 16, 52, 15, 48, 10) |
| 256 | w | (54, 40, 29, 20, 12, 39, 19, 50, 55, 28, 31, 34, 43, 35, 62, 47, 53, 30, 17, 3, 32, 52, 26, 44, 58, 5, 11, 25, 41, 27, 59, 0, 18, 15, 22, 45, 46, 37, 24, 23, 33, 10, 9, 13, 49, 56, 21, 61, 38, 8, 48, 14, 51, 7, 42, 1, 60, 63, 6, 4, 16, 57, 36, 2) |
| 512 | w | (4, 54, 11, 34, 26, 21, 1, 0, 37, 42, 13, 48, 25, 17, 12, 29, 35, 44, 63, 49, 46, 2, 40, 58, 8, 51, 57, 7, 23, 9, 41, 14, 32, 61, 36, 27, 60, 19, 38, 5, 15, 24, 55, 59, 31, 6, 3, 43, 52, 22, 62, 28, 33, 53, 56, 47, 10, 45, 20, 18, 30, 39, 50, 16) |
| 1024 | w | (61, 23, 16, 51, 11, 34, 62, 41, 50, 27, 58, 25, 54, 14, 37, 10, 8, 5, 20, 46, 47, 19, 49, 43, 17, 24, 22, 60, 12, 38, 6, 15, 9, 42, 29, 32, 21, 56, 7, 18, 36, 33, 44, 0, 52, 39, 40, 48, 45, 55, 63, 53, 30, 2, 1, 4, 59, 26, 13, 35, 31, 28, 3, 57,) |
| 2048 | w | (56, 30, 5, 2, 42, 51, 23, 12, 35, 26, 27, 28, 31, 7, 16, 11, 13, 48, 1, 39, 6, 34, 4, 10, 36, 61, 63, 25, 9, 47, 15, 38, 44, 43, 24, 53, 32, 29, 46, 3, 49, 20, 41, 21, 33, 14, 45, 37, 8, 62, 54, 0, 55, 19, 52, 17, 58, 59, 40, 18, 22, 57, 50, 60,) |
| 4096 | w | (5, 23, 60, 3, 59, 38, 18, 1, 54, 11, 30, 49, 42, 34, 13, 46, 20, 45, 48, 2, 15, 35, 41, 27, 9, 36, 10, 56, 8, 26, 58, 47, 33, 14, 37, 12, 61, 4, 7, 22, 0, 25, 40, 44, 16, 39, 52, 28, 53, 55, 31, 29, 50, 6, 57, 32, 43, 62, 21, 51, 63, 24, 19, 17,) |
| 8192 | w | (37, 55, 60, 35, 27, 38, 18, 33, 54, 43, 30, 17, 42, 34, 45, 46, 20, 13, 48, 2, 47, 3, 9, 59, 41, 36, 10, 56, 8, 26, 58, 15, 1, 14, 5, 12, 29, 4, 39, 22, 0, 57, 40, 44, 16, 7, 52, 28, 21, 23, 63, 61, 50, 6, 25, 32, 11, 62, 53, 19, 31, 24, 51, 49,) |
| 16384 | w | (41, 35, 44, 63, 23, 30, 58, 21, 46, 39, 54, 5, 50, 10, 17, 6, 36, 49, 48, 42, 59, 31, 29, 55, 61, 52, 18, 24, 40, 34, 2, 27, 53, 38, 9, 60, 1, 20, 19, 14, 0, 13, 8, 28, 16, 51, 4, 12, 25, 3, 11, 33, 26, 62, 45, 32, 7, 22, 57, 47, 43, 56, 15, 37,) |

TABLE 22

Relative Prime Interleaver Parameters

| K | p | s |
|---|---|---|
| 128 | 113 | 41 |
| 256 | 51 | 45 |
| 512 | 275 | 35 |
| 1024 | 967 | 4 |
| 2048 | 2201 | 55 |
| 4096 | 2531 | 0 |
| 8192 | 9539 | 0 |
| 16384 | 9239 | 0 |

Serial to parallel converter 606 transforms the output of interleaver 604 from serial form to parallel form. Specifically, the bits from interleaver 604 are grouped into groups of J bits and input to single parity check (SPC) module 608.

SPC module 608 performs a single parity check operation on each group of J input bits. According to one embodiment of the invention, SPC module 608 is implemented as a circuit that exclusive-ORs the J bits together to generate a single output bit for every group of J input bits. Here, the value of J is programmable and controls the overall rate of the code associated with encoder 600. As mentioned previously, this overall rate of the code is approximately J/(J+2). The J values used in each rate are shown in Table 23. In one embodiment, if the number of bits from the interleaver are not divisible by J, the remaining bits (<J) are simply exclusive-ORed together to form the final output bit of the SPC module 608.

TABLE 23

Values of J for each code rate

| Rate | J |
|---|---|
| 1/2 | 2 |
| 2/3 | 4 |
| 3/4 | 6 |
| 4/5 | 8 |
| 5/6 | 10 |
| 7/8 | 14 |
| 8/9 | 16 |
| 19/20 | 38 |

Inner code module 610 encodes the data received from SPC module 608. Here, the inner encoder is a rate 1/1, 4-state convolutional code with a time varying trellis. There are L input bits to the inner encoder, and L output bits. The input bits are considered as pairs of bits and are labeled $\{d_0^1 d_0^2 d_1^1 d_1^2 \ldots d_k^1 d_k^2 \ldots d_{L/2-1}^1 d_{L/2-1}^2\}$. The output bits are considered as pairs of bits and are labeled $\{p_0^1 p_0^2 p_1^1 p_1^2 \ldots p_1^1 p_1^2 \ldots p_{L/2-1}^1 p_{L/2-1}^2\}$. The first bit in each set corresponds to the earliest bit in time. There are 2 different trellis sections used in the inner code, each corresponding to a pair of input bits, and these are described in Table 24 and Table 25. In these tables all combinations of current state and input pairs are given, along with the corresponding output pair and next state.

TABLE 24

Inner Trellis Section Number 0

| Current state $S_k$ | Input bits $d_k^1 d_k^2$ | Output bits $p_k^1 p_k^2$ | Next state $S_{k+1}$ |
|---|---|---|---|
| 0 | 00 | 00 | 0 |
| 0 | 10 | 10 | 3 |
| 0 | 01 | 01 | 2 |
| 0 | 11 | 11 | 1 |
| 1 | 00 | 10 | 3 |
| 1 | 10 | 00 | 0 |
| 1 | 01 | 11 | 1 |
| 1 | 11 | 01 | 2 |
| 2 | 00 | 01 | 1 |
| 2 | 10 | 11 | 2 |
| 2 | 01 | 00 | 3 |
| 2 | 11 | 10 | 0 |
| 3 | 00 | 11 | 2 |
| 3 | 10 | 01 | 1 |
| 3 | 01 | 10 | 0 |
| 3 | 11 | 00 | 3 |

TABLE 25

Inner Trellis Section Number 1

| Current state $S_k$ | Input bits $d_k^1 d_k^2$ | Output bits $p_k^1 p_k^2$ | Next state $S_{k+1}$ |
|---|---|---|---|
| 0 | 00 | 00 | 0 |
| 0 | 10 | 11 | 3 |
| 0 | 01 | 01 | 2 |
| 0 | 11 | 10 | 1 |
| 1 | 00 | 01 | 3 |
| 1 | 10 | 10 | 0 |
| 1 | 01 | 00 | 1 |
| 1 | 11 | 11 | 2 |
| 2 | 00 | 11 | 1 |
| 2 | 10 | 00 | 2 |
| 2 | 01 | 10 | 3 |
| 2 | 11 | 01 | 0 |
| 3 | 00 | 10 | 2 |
| 3 | 10 | 01 | 1 |
| 3 | 01 | 11 | 0 |
| 3 | 11 | 00 | 3 |

These trellis sections are combined together in 4 different trellis patterns, each consisting of 16 trellis sections. The 4 default trellis patterns are shown in Table 26. According to one embodiment of the invention, encoder 600 allows these trellis patterns to be reprogrammed. The first trellis section in each trellis pattern is used as the first trellis section in the frame, followed by the second trellis section, and so on.

TABLE 26

Inner Trellis Patterns

| Trellis Pattern Number | Trellis Pattern |
|---|---|
| 0 | 1111111111111111 |
| 1 | 0000000000000000 |
| 2 | 1010101010101010 |
| 3 | 1100110011001100 |

The defaults trellis patterns for each mode are shown in Table 27, Table 28, Table 29, and Table 30. According to one embodiment of the invention, encoder 600 allows the trellis patterns for each mode to be reprogrammed. These patterns have been selected to provide superior threshold performance with a floor below a BER of $10^{-10}$.

In this example, the state of the inner encoder is initialized to the all-zero state at the beginning of each frame ($S_0=0$). Here, no termination is performed at the end of the frame.

TABLE 27

Inner Trellis Patterns for BPSK/QPSK

| Frame Size | Code Rate |  |  |  |  |  |  |  |
|---|---|---|---|---|---|---|---|---|
|  | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 28

Inner Trellis Patterns for 8PSK

| Frame Size | Code Rate |  |  |  |  |  |  |  |
|---|---|---|---|---|---|---|---|---|
|  | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |

TABLE 28-continued

Inner Trellis Patterns for 8PSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 29

Inner Trellis Patterns for 16QAM

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 30

Inner Trellis Patterns for 16APSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

Mapper 612 receives the output of inner code module 610 (parity bits), as well as the original input data (systematic bits), and maps the parity bits and systematic bits to BPSK, QPSK, 8PSK, 16QAM, or 16APSK symbols. In this example, Gray mapping is used, as shown in FIG. 7. The order in which the systematic and parity bits are mapped to the constellations depends on the code rate and the modulation.

Figure 7A:
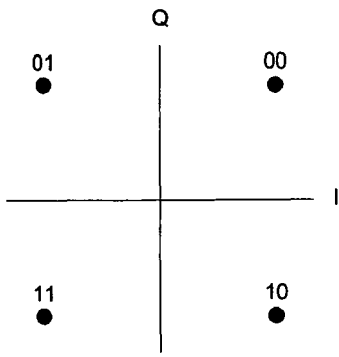
FIG. 7A presents a Gray-mapped constellation of possible symbols for a QPSK modulation scheme, according to one embodiment of the invention.
Figure 7B:
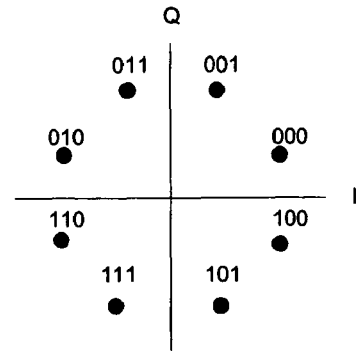
FIG. 7B presents a Gray-mapped constellation of possible symbols for a 8PSK modulation scheme, according to one embodiment of the invention.
Figure 7C:
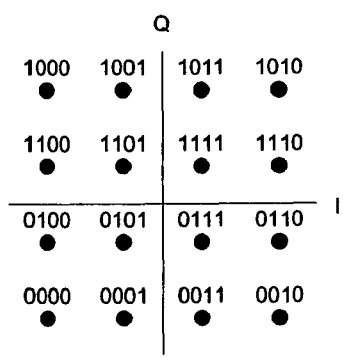
FIG. 7C presents a Gray-mapped constellation of possible symbols for a 16QAM modulation scheme, according to one embodiment of the invention.
Figure 7D:
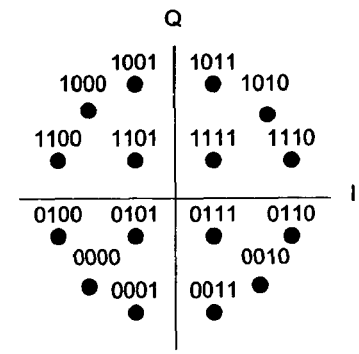
FIG. 7D presents a Gray-mapped constellation of possible symbols for a 16APSK modulation scheme, according to one embodiment of the invention.

Specifically, FIG. 7A presents a Gray-mapped constellation of possible symbols for a QPSK modulation scheme, according to one embodiment of the invention. FIG. 7B presents a Gray-mapped constellation of possible symbols for a 8PSK modulation scheme, according to one embodiment of the invention. FIG. 7C presents a Gray-mapped constellation of possible symbols for a 16QAM modulation scheme, according to one embodiment of the invention. FIG. 7D presents a Gray-mapped constellation of possible symbols for a 16APSK modulation scheme, according to one embodiment of the invention.

Here, there are K systematic bits and L parity bits. These are considered as pairs of bits: the systematic bits are labeled $\{S_0^1 S_0^2 S_1^1 S_1^2 \ldots S_k^1 S_k^2 \ldots S_{K/2-1}^1 S_{K/2-1}^2\} = \{b_1^1 b_1^2 \ldots b_k^1 b_k^2 \ldots b_{K/2-1}^1 b_{K/2-1}^2 b_0^1 b_0^2\}$ (note the reordering of the first pair of input bits due to the tail biting termination of the outer code), and the parity bits are labeled $\{p_0^1 p_0^2 p_1^1 p_1^2 \ldots p_1^1 p_1^2 \ldots p_{L/2-1}^1 p_{L/2-1}^2\}$. The first bit in each set corresponds to the earliest bit in time. When there are an odd number of parity bits a zero bit is inserted in the last pair in the least significant bit (LSB) position $\{p_1^2\}$. The number of parity bits is therefore:

$$L = \left\lceil \frac{2K}{J} \right\rceil_2$$

where $\lceil x \rceil_2$ denotes the next highest multiple of 2 above x.

According to one embodiment of the invention, in QPSK mode, symbols are formed from either a pair of systematic bits or a pair of parity bits. When the kth systematic symbol is transmitted $S_k^1$ is mapped to the LSB of the symbol label shown in FIG. 7A, and $S_k^2$ is mapped to the most significant bit (MSB). When the lth parity symbol is transmitted $p_l^1$ is mapped to the LSB of the symbol label shown in FIG. 7A, and $p_l^2$ is mapped to the MSB. The systematic and parity symbols are interlaced on the channel, depending on the code rate. The mapping pattern is shown in Table 31, where s is a systematic symbol, and p is a parity symbol. The first symbol of a frame uses the first indicator in the mapping pattern; the second symbol in the frame uses the second indicator in the mapping pattern, and so on. When the mapping pattern is exhausted it is cycled back to the beginning. When the end of the frame is reached part way through the mapping pattern it is simply truncated, and the first symbol of the next frame uses the first indicator in the mapping pattern again. Here, an even number of symbols is always transmitted. If the end of the frame is reached when a symbol pair is partially complete it is filled with zero bits. The total number of symbols S in QPSK mode is therefore:

$$S_4 = \left\lceil \frac{K+L}{2} \right\rceil_2$$

TABLE 31

QPSK Mapping Patterns

| Rate | Mapping pattern |
|---|---|
| 1/2 | ps |
| 2/3 | pss |
| 3/4 | psss |
| 4/5 | pssss |
| 5/6 | psssss |
| 7/8 | pssssss |
| 8/9 | psssssss |
| 19/20 | pssssssssssssssssss |

According to one embodiment of the invention, in BPSK mode, the mapping is the same as in QPSK mode, except that I and Q are interlaced. The QPSK I channel corresponds to the first BPSK symbol.

In 8PSK mode two symbols are formed at a time from either three pairs of systematic bits, three pairs of parity bits, or a mixture of two pairs of systematic bits and one pair of parity bits. An all-systematic symbol-pair is formed from the pairs $\{S_k^1 S_k^2\}$, $\{S_{k+1}^1 S_{k+1}^2\}$ and $\{S_{k+2}^1 S_{k+2}^2\}$. The symbol label of the first 8PSK symbol is $\{S_k^2 S_k^1 S_{k+2}^1\}$ where $S_k^2$ is the MSB of the symbol label shown in FIG. 7B, and $S_{k+2}^1$ is the LSB. The symbol label of the second 8PSK symbol is $\{S_{k+1}^2 S_{k+1}^1 S_{k+2}^2\}$ where $S_{k+1}^2$ is the MSB of the symbol label shown in FIG. 7B, and $S_{k+2}^2$ is the LSB. An all-parity symbol-pair is formed from the pairs $\{p_l^1 p_l^2\}$, $\{p_{l+1}^1 p_{l+1}^2\}$ and $\{p_{l+2}^1 p_{l+2}^2\}$. The symbol label of the first 8PSK symbol is $\{p_l^2 p_l^1 p_{l+2}^2\}$ where $p_l^2$ is the MSB of the symbol label shown in FIG. 7B, and $p_{l+2}^1$ is the LSB. The symbol label of the second 8PSK symbol is $\{p_{l+1}^2 p_{l+1}^1 p_{l+2}^2\}$ where $p_{l+1}^2$ is the MSB of the symbol label shown in FIG. 7B, and $p_{l+2}^2$ is the LSB. A mixed systematic and parity symbol-pair is formed from the pairs $\{S_k^1 S_k^2\}$, $\{S_{k+1}^1 S_{k+1}^2\}$ and $\{p_l^1 p_l^2\}$. The symbol label of the first 8PSK symbol is $\{S_k^2 S_k^1 p_l^1\}$ where $S_k^2$ is the MSB of the symbol label shown in FIG. 7B, and $p_l^1$ is the LSB. The symbol label of the second 8PSK symbol is $\{S_{k+1}^2 S_{k+1}^1 p_l^2\}$ where $S_{k+1}^2$ is the MSB of the symbol label shown in FIG. 7B, and $p_l^2$ is the LSB.

In this example, the systematic, parity, and mixed symbols are interlaced on the channel, depending on the code rate. The mapping pattern is shown in Table 32, where s is an all-systematic symbol-pair, p is an all-parity symbol-pair, and m is a mixed systematic and parity symbol-pair. The first symbol-pair of a frame uses the first indicator in the mapping pattern; the second symbol-pair in the frame uses the second indicator in the mapping pattern, and so on. When the mapping pattern is exhausted it is cycled back to the beginning. When the end of the frame is reached part way through the mapping pattern it is simply truncated, and the first symbol-pair of the next frame uses the first indicator in the mapping pattern again. An even number of symbols is always transmitted. If the end of the frame is reached when a symbol-pair is partially complete it is filled with zero bits. The total number of symbols S in 8PSK mode is therefore $$S_8 = \left\lceil \frac{K+L}{3} \right\rceil_2$$

TABLE 32

8PSK Mapping Patterns

| Rate | Mapping pattern |
|---|---|
| 1/2 | pmmm |
| 2/3 | m |
| 3/4 | mmms |
| 4/5 | msmms |
| 5/6 | ms |
| 7/8 | mssmssms |
| 8/9 | mss |
| 19/20 | mssssmsssssmssssss |

According to one embodiment of invention, in 16QAM and 16APSK modes, one symbol is formed at a time from either two pairs of systematic bits, two pairs of parity bits, or a mixture of one pair of systematic bits and one pair of parity bits. An all-systematic symbol is formed from the pairs $\{S_k^1 S_k^2\}$ and $\{S_{k+1}^1 S_{k+1}^2\}$. The symbol label of the 16QAM/16APSK symbol is $\{S_k^2 S_{k+1}^2 S_k^1 S_{k+1}^1\}$ where $S_k^2$ is the MSB of the symbol label shown in FIGS. 7C and 7D, and $S_{k+1}^1$ is the LSB. An all-parity symbol is formed from the pairs $\{p_l^1 p_l^2\}$ and $\{p_{l+1}^1 p_{l+1}^2\}$. The symbol label of the 16QAM/16QAPSK symbol is $\{p_l^2 p_{l+1}^2 p_l^1 p_{l+1}^1\}$ where $p_l^2$ is the MSB of the symbol label shown in FIGS. 7C and 7D, and $p_{l+1}^1$ is the LSB. A mixed systematic and parity symbol is formed from the pairs $\{S_k^1 S_k^2\}$ and $\{p_l^1 p_l^2\}$. The symbol label of the 16QAM/16APSK symbol is $\{S_k^2 p_l^2 S_k^1 p_l^1\}$ where $S_k^2$ is the MSB of the symbol label shown in FIGS. 7A through 7D, and $p_l^1$ is the LSB.

Again in this example, the systematic, parity and mixed symbols are interlaced on the channel, depending on the code rate. The mapping pattern is shown in Table 33, where s is an all-systematic symbol, p is an all-parity symbol, and m is a mixed systematic and parity symbol. The first symbol of a frame uses the first indicator in the mapping pattern; the second symbol in the frame uses the second indicator in the mapping pattern, and so on. When the mapping pattern is exhausted it is cycled back to the beginning. When the end of the frame is reached part way through the mapping pattern it is simply truncated, and the first symbol of the next frame uses the first indicator in the mapping pattern again. An even number of symbols is always transmitted. If the end of the frame is reached when a symbol pair is partially complete it is filled with zero bits. The total number of symbols S in 16QAM and 16APSK modes is therefore:

$$S_{16} = \left\lceil \frac{K+L}{4} \right\rceil_2$$

TABLE 33

16QAM/16APSK Mapping Patterns

| Rate | Mapping pattern |
|---|---|
| 1/2 | m |
| 2/3 | mms |
| 3/4 | ms |
| 4/5 | msmss |
| 5/6 | mss |
| 7/8 | msss |
| 8/9 | msssmssss |
| 19/20 | mssssssss |

In the present example, the number of output symbols of encoder 600 is shown in Table 34 for BPSK/QPSK mode, in Table 35 for 8PSK, and in Table 36 for 16QAM/16APSK.

TABLE 34

Number of encoder output symbols for BPSK/QPSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 128 | 96 | 86 | 80 | 78 | 74 | 72 | 68 |
| 256 | 256 | 192 | 172 | 160 | 154 | 148 | 144 | 136 |
| 512 | 512 | 384 | 342 | 320 | 308 | 294 | 288 | 270 |
| 1024 | 1024 | 768 | 684 | 640 | 616 | 586 | 576 | 540 |
| 2048 | 2048 | 1536 | 1366 | 1280 | 1230 | 1172 | 1152 | 1078 |
| 4096 | 4096 | 3072 | 2732 | 2560 | 2458 | 2342 | 2304 | 2156 |

TABLE 34-continued

Number of encoder output symbols for BPSK/QPSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 8192 | 8192 | 6144 | 5462 | 5120 | 4916 | 4682 | 4608 | 4312 |
| 16384 | 16384 | 12288 | 10924 | 10240 | 9832 | 9364 | 9216 | 8624 |

TABLE 35

Number of encoder output symbols for 8PSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 86 | 64 | 58 | 54 | 52 | 50 | 48 | 46 |
| 256 | 172 | 128 | 114 | 108 | 104 | 98 | 96 | 90 |
| 512 | 342 | 256 | 228 | 214 | 206 | 196 | 192 | 180 |
| 1024 | 684 | 512 | 456 | 428 | 410 | 392 | 384 | 360 |
| 2048 | 1366 | 1024 | 912 | 854 | 820 | 782 | 768 | 720 |
| 4096 | 2732 | 2048 | 1822 | 1708 | 1640 | 1562 | 1536 | 1438 |
| 8192 | 5462 | 4096 | 3642 | 3414 | 3278 | 3122 | 3072 | 2876 |
| 16384 | 10924 | 8192 | 7282 | 6828 | 6554 | 6242 | 6144 | 5750 |

TABLE 36

Number of encoder output symbols for 16QAM/16APSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 64 | 48 | 44 | 40 | 40 | 38 | 36 | 34 |
| 256 | 128 | 96 | 86 | 80 | 78 | 74 | 72 | 68 |
| 512 | 256 | 192 | 172 | 160 | 154 | 148 | 144 | 136 |
| 1024 | 512 | 384 | 342 | 320 | 308 | 294 | 288 | 270 |
| 2048 | 1024 | 768 | 684 | 640 | 616 | 586 | 576 | 540 |
| 4096 | 2048 | 1536 | 1366 | 1280 | 1230 | 1172 | 1152 | 1078 |
| 8192 | 4096 | 3072 | 2732 | 2560 | 2458 | 2342 | 2304 | 2156 |
| 16384 | 8192 | 6144 | 5462 | 5120 | 4916 | 4682 | 4608 | 4312 |

Decoder

Figure 8:
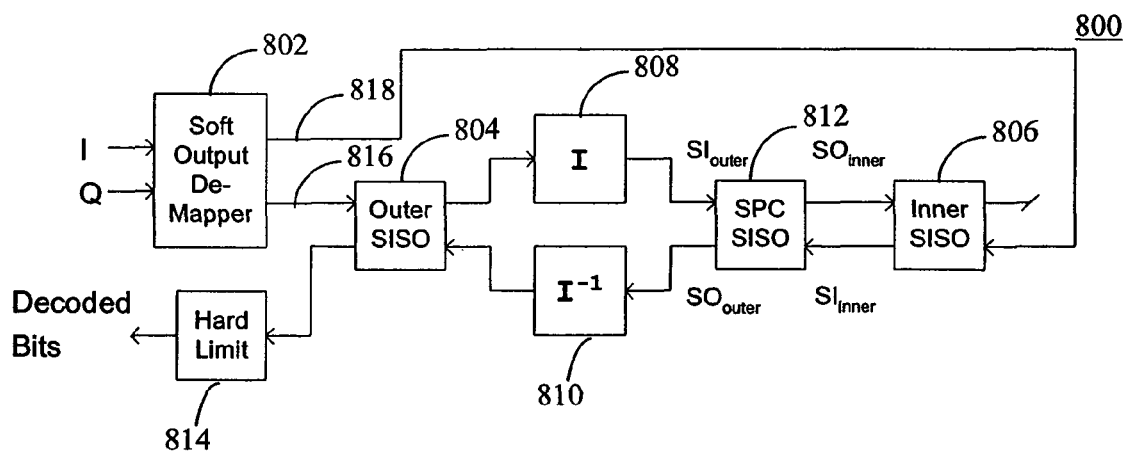
FIG. 8 is an illustrative block diagram of a decoder 800 for an improved error correction coding scheme according to one embodiment of the present invention.

FIG. 8 is an illustrative block diagram of a decoder 800 for an improved error correction coding scheme according to one embodiment of the present invention. Here, decoder 800 comprises a soft output demapper 802, an outer soft-input-soft-output (SISO) module 804, an inner SISO module 806, an interleaver 808, a de-interleaver 810, a single parity check (SPC) SISO module 812, and a hard limiter 814.

As shown in the figure, soft output demapper 802 received I and Q samples obtained from the channel. In accordance with the appropriate modulation scheme, soft output demapper 802 demaps the I and Q samples into soft channel metrics. The channel metrics for the systematic bits (systematic channel metrics 816) are passed to outer SISO module 804, and the channel metrics for the parity bits (parity channel metrics 818) are passed to the inner SISO module 806. Here, the systematic nature of the code requires decoding to commence with the outer code.

The outer code may be decoded in the same way in which the outer code in an SCCC is decoded, using a SISO decoding algorithm such as the well-known forward-backward algorithm. The forward-backward algorithm is described, for example, in L. R. Bahl et al., "Optimal Decoding of Linear Codes for Minimizing Symbol Error Rate," *IEEE Trans. Info. Theory*, vol. IT-20, March 1974, pp. 248-87.

Next, the SPC code is decoded in the outer-inner direction. Interleaver 808 interleaves the soft outputs of outer SISO module 804. Here, interleaver 808 has a block length of 2K, corresponding to the block length of interleaver 604 of encoder 600 shown in FIG. 6. SPC SISO module 812 receives from interleaver 808 the interleaved version of the outer code soft outputs. Here, one soft output is generated for every J soft inputs. This corresponds to the J input bits to SPC encoder 608 of encoder 600 shown in FIG. 6. SPC SISO module 812 may use the well-known message-passing algorithm to process soft inputs and soft outputs. The message-passing algorithm is described, for example, in R. Gallager, "Low Density Parity-Check Codes," *IRE Trans. Info. Theory*, vol. 7, January 1962, pp. 21-28.

There are 2K soft-inputs (denoted $SI_{outer}$) to SPC SISO module 812 from the outer SISO module 804, and 2K/J soft-outputs (denoted $SO_{inner}$) to inner SISO module 806. The soft-outputs are calculated using the following expression:

$$SO_{inner}^k = g(SI_{outer}^{Jk}, SI_{outer}^{Jk+1}, \ldots, SI_{outer}^{Jk+J-1}), \text{ for } 0 \leq k < 2K/J$$

where g is the recursive function:

$$g(a,b) = \text{sgn}(a) \times \text{sgn}(b) \times \min(|a|, |b|) + f(a,b)$$

and f is:

$$f(a, b) = \log\left(\frac{1 + e^{-|a+b|}}{1 + e^{-|a-b|}}\right)$$

which can be implemented in a look up table, according to one embodiment of the invention.

The SPC soft-outputs $SO_{inner}$ from SPC SISO module 812 are then used as inputs to inner SISO module 806. The inner code may be decoded in the same way as the inner code in an SCCC is decoded, using a SISO decoding algorithm such as the well-known forward-backward algorithm mentioned above.

Next the SPC code must be decoded in the inner-outer direction, using the soft outputs of inner SISO module 806. In this direction, J soft outputs must be generated for every soft input. There are 2K/J soft-inputs (denoted $SI_{inner}$) to the SPC SISO module 812 from inner SISO module 806, and 2K soft-outputs (denoted $SO_{outer}$) to outer SISO module 804. The soft-outputs are calculated using the following expression:

$$SO_{outer}^i = g(SI_{outer}^{J\lfloor i/J \rfloor}, SI_{outer}^{J\lfloor i/J \rfloor+1}, \ldots, SI_{outer}^{j=i}, \ldots, SI_{outer}^{J\lfloor i/J \rfloor+J-1}, SI_{inner}^{\lfloor i/J \rfloor}), \text{ for } 0 \leq i < 2K$$

These SPC soft outputs $SO_{outer}$ are de-interleaved by de-interleaver 810 before being sent to outer SISO module 804. Here, de-interleaver 810 has a block length of 2K, corresponding to the block length of interleaver 604 of encoder 600 shown in FIG. 6. Outer SISO module 804 receives the de-interleaved version of the SPC soft outputs $SO_{outer}$. The entire process described above involving soft output demapper 802, SISO module 804, inner SISO module 806, interleaver 808, de-interleaver 810, and SPC SISO module 812 may be iterated one or more times by decoder 800, to improve the soft outputs generated by outer SISO module 804.

The number iterations performed by decoder 800 may be adjustable and may be adjusted to predetermined values for different conditions, in accordance with one embodiment of the invention. For example, the number of iterations may vary depending on performance criteria such as BER performance and settings such as data frame size, coding rate, and modulation. According to one implementation, decoder 800 may be capable of being adjusted to perform between 1 and 32 iterations. Under certain conditions, 6-8 iterations yield good performance, and performing beyond 20 iterations may not provide significant performance gains.

After the appropriate number of iterations are carried out, the soft outputs from outer SISO module 804 may hard-limited by hard limiter 814 to produce the decoded bits that are output by decoder 800, in accordance with the present embodiment of the invention.

Specific Example of Decoder

A specific example of an decoder that flexibly performs decoding for different data frame sizes, coding rates, and modulations may be implemented as an application-specific integrated circuit (ASIC), in accordance with one embodiment of the invention. The structure presented previously as decoder 800 is utilized again for illustrative purposes. Here, the decoder may operate with eight default frame sizes ranging from 128 bits to 16384 bits, as listed below.

128 bits;
256 bits;
512 bits;
1024 bits;
2048 bits;
4096 bits;
8192 bits; and
16384 bits.

These data frame sizes are presented for illustrative purpose. Other sizes may also be adopted. In accordance with one embodiment of the invention, the decoder may be reprogrammed to support different sets of frame sizes. For example, the decoder may be reprogrammed to support another set of eight different frame sizes. Also, the decoder may allow the frame size to be selected from the available sizes on a frame-by-frame basis.

Here, the decoder supports eight different code rates, as listed below. These code rates are presented for illustrative purposes. Other code rates may also be used in accordance with the present invention. The decoder may also allow the code rate to be selectable on a frame-by-frame basis.

1/2;
2/3;
3/4;
4/5;
5/6;
7/8;
8/9; and
19/20.

The decoder may be capable of handling different types of modulation mappings, such as those listed below.

BPSK;
QPSK;
8PSK;
16QAM; and
16 APSK

These mappings are presented for illustrative purposes. Other mappings may also be adopted in accordance with the invention.

Performance

FIGS. 9-14 show performance results demonstrating the performance and flexibility of an improved error correction coding scheme in accordance with one embodiment of the invention. These performance results correspond to an implementation of the decoder using a specific ASIC design. The results reflect measurements which include implementation losses. Accordingly, an ideal implementation of may achieve better performance than that shown in these figures. The ASIC used for these measurements utilize a Structured ASIC design, as is well known in the art. This ASIC is implemented with a system clock speed of 105 MHz. In another embodiment, the ASIC may utilize a Standard Cell ASIC design, which is also well known in the art. Such a design may facilitate a higher clock speed and thus higher throughput.

Figure 9:
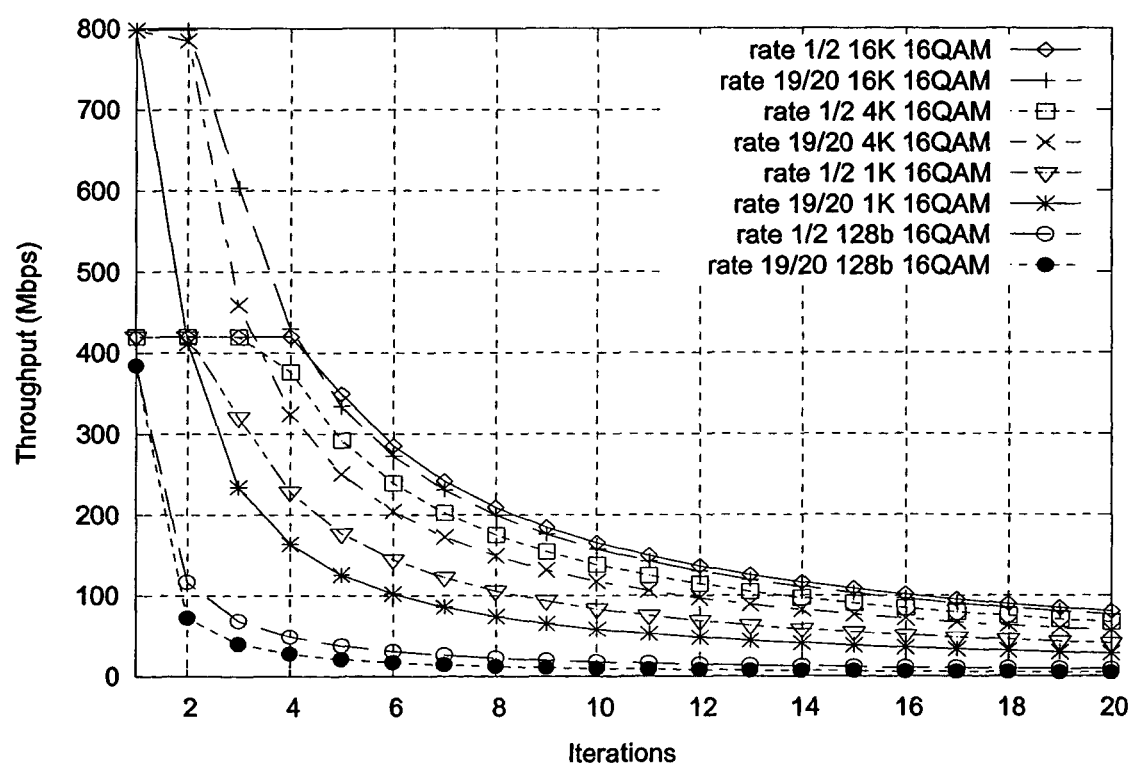
FIG. 9. demonstrates the throughput performance of a decoder for the improved error correction coding scheme, according to one embodiment of the present invention.

FIG. 9. demonstrates the throughput performance of a decoder for the improved error correction coding scheme, according to one embodiment of the present invention. For various combinations of coding rate, frame size, and modulation scheme, throughput is plotted against the number of iterations performed by the decoder.

Figure 10:
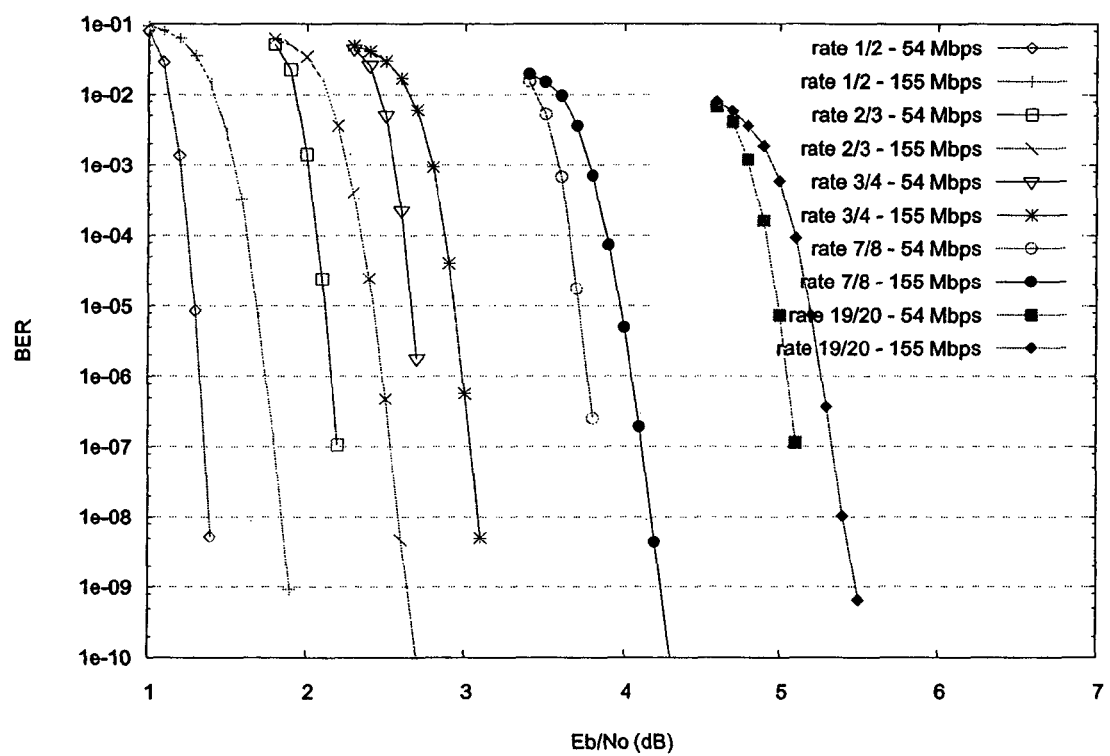
FIG. 10 demonstrates the code rate flexibility of a decoder for the improved error correction coding scheme, according to one embodiment of the present invention.

FIG. 10 demonstrates the code rate flexibility of a decoder for the improved error correction coding scheme, according to one embodiment of the present invention. This figure shows the performance of the decoder with QPSK modulation, a frame size of 16K bits, and a range of code rates from rate 1/2 to rate 19/20. These codes rates are selected for illustrative purposes. In at least one embodiment of the invention, the decoder supports more rates than those shown in the figure. Results for two different numbers of iterations are shown for each case: Sufficient iterations to support 54 Mbps operation; and sufficient iterations to support 155 Mbps operation.

Figure 11:
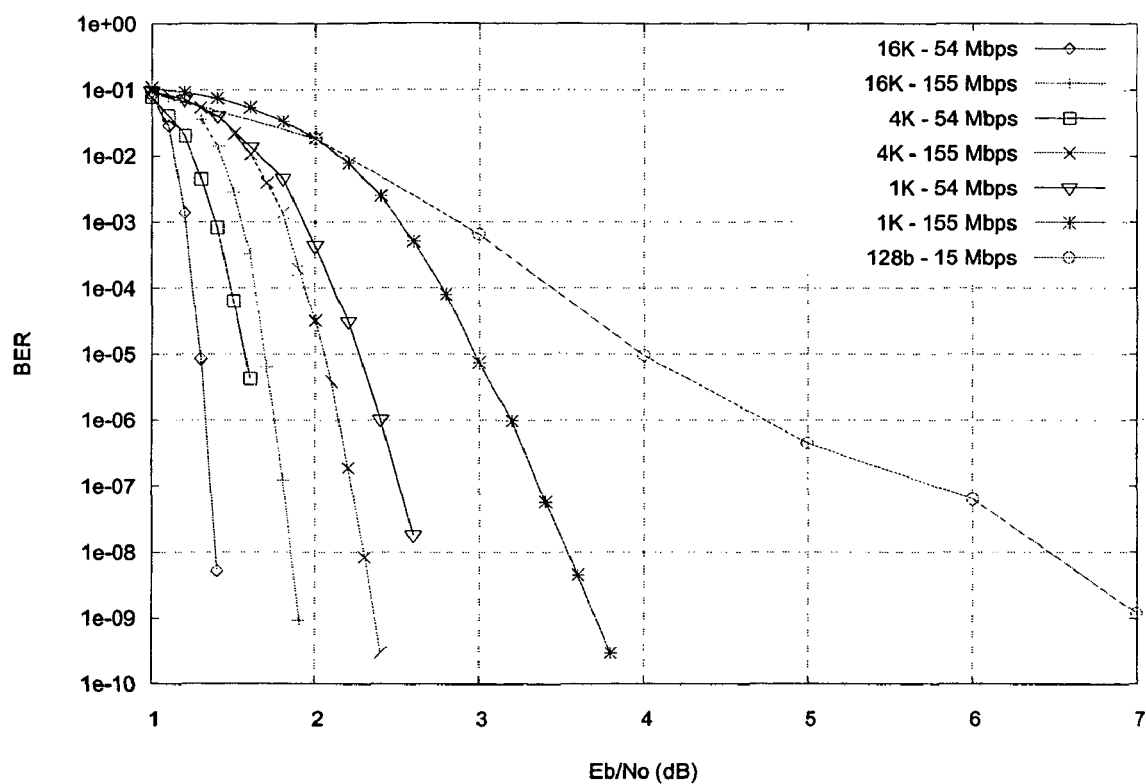
FIG. 11 demonstrates the frame size flexibility of a decoder for the improved error correction coding scheme, according to one embodiment of the present invention.

FIG. 11 demonstrates the frame size flexibility of a decoder for the improved error correction coding scheme, according to one embodiment of the present invention. This figure shows the performance of the decoder with QPSK modulation, a code rate of 1/2, and a range of frame sizes from 16K bits down to 128 bits. These frame sizes are shown for illustrative purposes. In at least one embodiment of the invention, the decoder supports more frame sizes than those shown in the figure. Results for two different numbers of iterations are shown for each case: Sufficient iterations to support 54 Mbps operation; and sufficient iterations to support 155 Mbps operation (except the 128 bit case, which has a reduced throughput due to higher overheads in the decoder).

Figure 12:
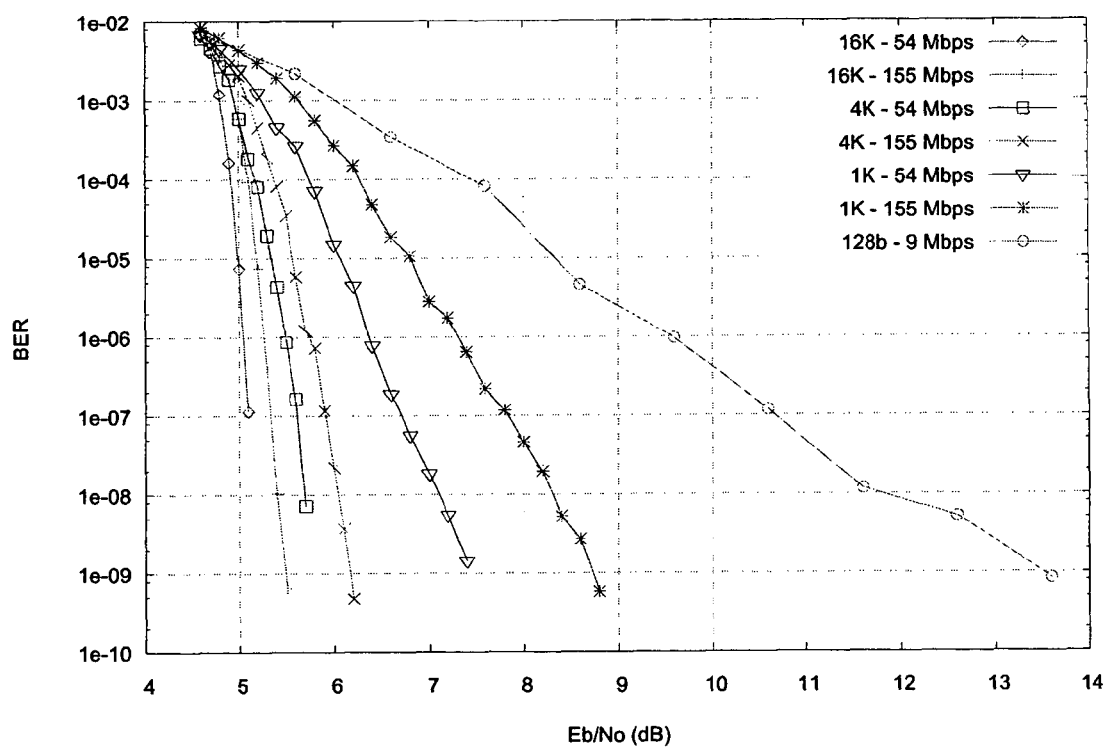
FIG. 12 demonstrates the frame size flexibility, at an extreme code rate, of a decoder for the improved error correction coding scheme, according to one embodiment of the present invention.

FIG. 12 demonstrates the frame size flexibility, at an extreme code rate, of a decoder for the improved error correction coding scheme, according to one embodiment of the present invention. This figure shows the performance of the decoder with QPSK modulation, a code rate of 19/20, and a range of frame sizes from 16K bits down to 128 bits. Again, the decoder may support more frame sizes than those shown in the figure. Results for two different numbers of iterations are shown for each case: Sufficient iterations to support 54 Mbps operation; and sufficient iterations to support 155 Mbps operation (except the rate 19/20 case, which has a reduced throughput).

Figure 13:
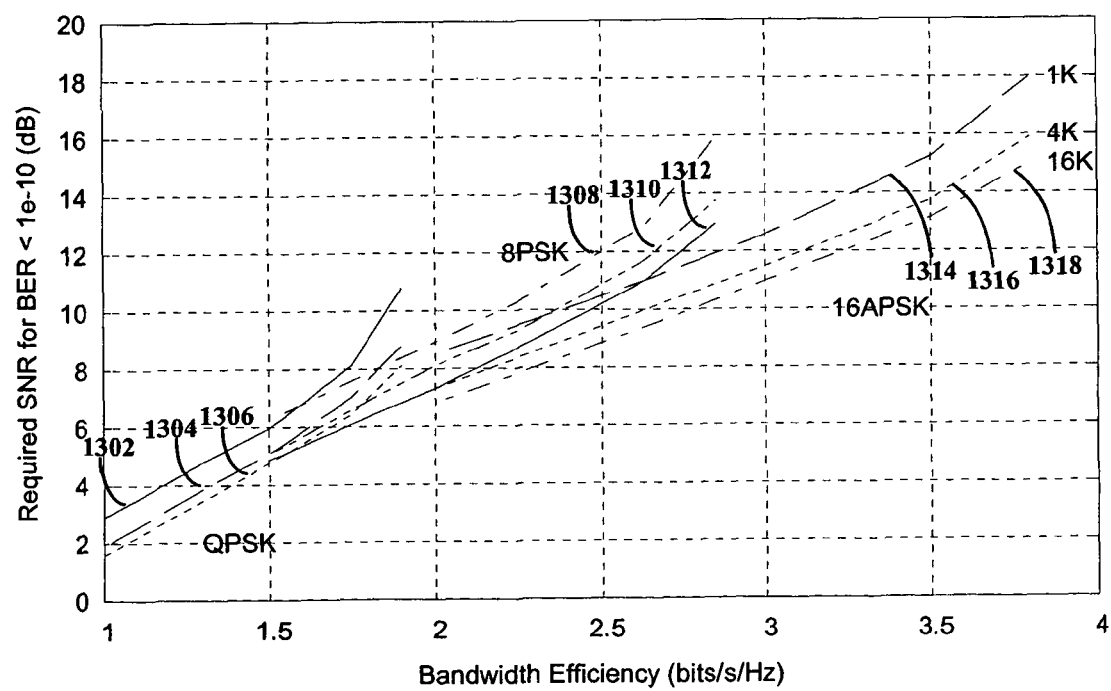
FIG. 13 demonstrates the modulation flexibility of a decoder for the improved error correction coding scheme, according to one embodiment of the present invention.

FIG. 13 demonstrates the modulation flexibility of a decoder for the improved error correction coding scheme, according to one embodiment of the present invention. This figure plots the required SNR ($E_b/N_0$) for a BER of 10-10 against bandwidth efficiency (measured as throughput per Hz of occupied bandwidth) for QPSK, 8PSK and 16APSK modulations and a range of frame sizes (the FlexiCode ASIC can also support BPSK and 16QAM). Specifically, curves 1302, 1304, and 1306 correspond to QPSK and frame sizes 1K, 4K, and 16K, respectively. Curves 1308, 1310, and 1312 correspond to 8PSK and frame sizes 1K, 4K, and 16K, respectively. Curves 1314, 1316, and 1318 correspond to 16APSK and frame sizes 1K, 4K, and 16K, respectively. Sufficient iterations have been used to support a throughput of 54 Mbps.

Figure 14:
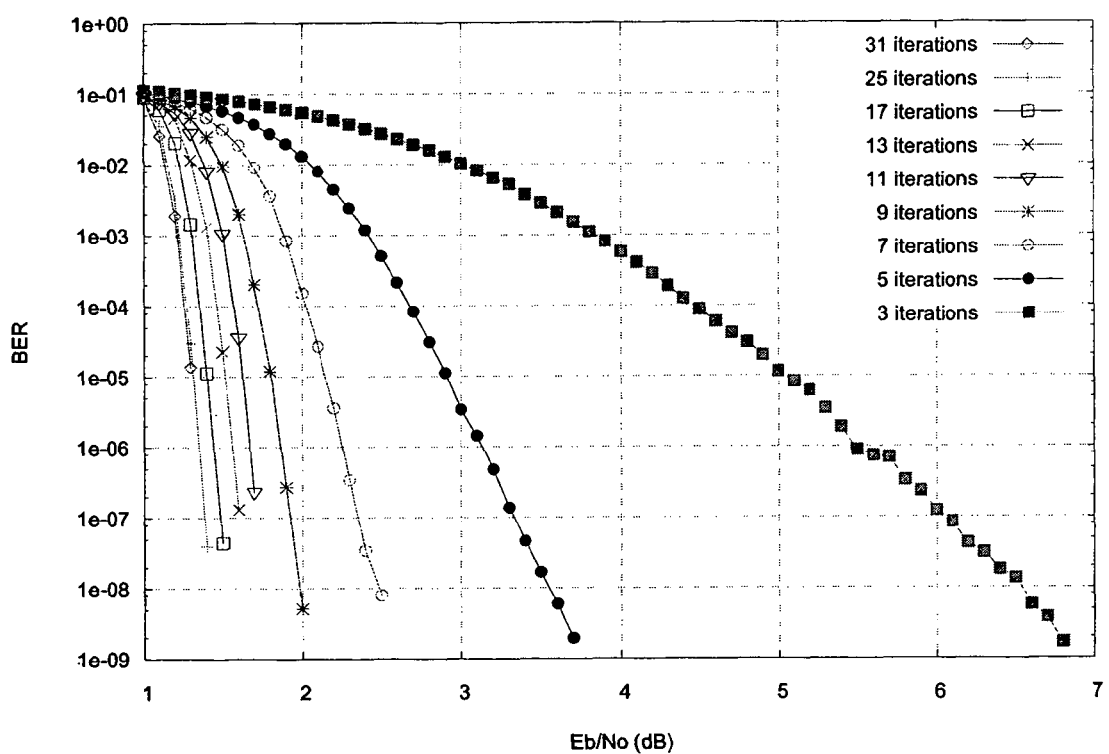
FIG. 14 demonstrates the convergence properties of a decoder for the improved error correction coding scheme, according to one embodiment of the present invention.

FIG. 14 demonstrates the convergence properties of a decoder for the improved error correction coding scheme, according to one embodiment of the present invention. This figure shows the performance of the decoder with QPSK modulation, a code rate of 1/2, a frame size of 16K bits, and a range of iterations. As can be seen there is only 0.2 dB gained from going from 11 iterations to 17 iterations, and only 0.1 dB gained from increasing the iterations beyond 17.

The improved error correction coding scheme presented in various embodiments above allows for increased flexibility in code rate, frame size, and modulation, without significantly increases in encoder or decoder complexity. Encoders and decoders designed in accordance with the present invention may be implemented using software, hardware, or a combination of software and hardware. For example, a decoder may be implemented as an ASIC, as previously mentioned. Other types of software, hardware, or combination of software and hardware may also be used.

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for performing data encoding comprising:
   encoding data bits according to an outer convolutional code to produce outer encoded bits;
   processing the outer encoded bits using an interleaver and a logical unit to produce intermediate bits, wherein the number of intermediate bits is less than the number of outer encoded bits;
   encoding the intermediate bits according to an inner convolutional code to produce inner encoded bits, wherein the inner convolutional code is characterized by at least two states; and
   combining the data bits and the inner encoded bits to produce encoded outputs.

2. The method of claim 1 wherein the logical unit performs a single parity check.

3. The method of claim 1 wherein the logical unit is implemented as an XOR circuit.

4. The method of claim 1 wherein the outer encoded bits are processed by the interleaver to generate interleaved bits, and the interleaved bits are processed by the logical unit to produce the intermediate bits.

5. The method of claim 1 wherein the encoded outputs represent symbols mapped according to a modulation scheme.

6. The method of claim 1 wherein the encoded outputs represent a plurality of bits.

7. The method of claim 1 wherein the number of input bits is variable to allow change in an overall coding rate.

8. The method of claim 1 wherein the number of output bits has a fixed value of 1.

9. The method of claim 1 wherein the inner convolutional code is associated with a time-varying trellis.

10. The method of claim 1 wherein the inner convolutional code is characterized by four states.

11. The method of claim 1 wherein the inner convolutional code is a rate 1/1 code.

12. The method of claim 1 wherein the outer convolutional code is associated with a time-varying trellis.

13. The method of claim 1 wherein the outer convolutional code is characterized by four states.

14. The method of claim 1 wherein the outer convolutional code is a rate 1/2 code.

15. A method for performing data decoding comprising:
    obtaining soft channel metrics derived from a channel; and
    decoding the soft channel metrics using an outer soft-input-soft-output (SISO) decoder, an inner SISO decoder, a logical unit SISO decoder, an interleaver, and a de-interleaver to produce decoded soft outputs;
    wherein the logical unit SISO decoder receives a first number of soft inputs from an outer SISO decoder direction and produces a corresponding second number of soft outputs, the second number being less than the first number; and
    wherein the logical unit SISO decoder receives the second number of soft inputs from an inner SISO decoder direction and produces a corresponding first number of soft outputs.

16. The method of claim 15 wherein the logical unit SISO decoder corresponds to an encoder logical unit that receives the first number of input bits and produces the second number of corresponding output bits, wherein the encoder logical unit takes each of the first number of input bits into account in producing the second number of output bits.

17. The method of claim 15 wherein the logical unit SISO decoder performs a single parity check decoding operation.

18. The method of claim 15 wherein the first number is variable to allow change in an overall coding rate.

19. The method of claim 15 wherein the second number has a fixed value of 1.

20. The method of claim 15 further comprising a step of hard limiting the decoded soft outputs to produce decoded bits.

21. An apparatus for performing data encoding comprising:
    an outer convolutional encoder capable of encoding data bits to produce outer encoded bits;
    an interleaver capable of processing data relating to the outer encoded bits to facilitate production of intermediate bits;
    a logical unit capable of processing data relating to the outer encoded bits to facilitate production of the intermediate bits, wherein the number of intermediate bits is less than the number of outer encoded bits;
    an inner convolutional encoder characterized by at least two states and capable of encoding the intermediate bits to produce inner encoded bits; and
    a combining unit capable of combining the data bits and the inner encoded bits to produce encoded outputs.

22. The apparatus of claim 21 wherein the logical unit performs a single parity check.

23. The apparatus of claim 21 wherein the logical unit is implemented as an XOR circuit.

24. The apparatus of claim 21 wherein the interleaver is capable of processing the outer encoded bits to generate interleaved bits, and the logical unit is capable of processing the interleaved bits to produce the intermediate bits.

25. An apparatus for performing data decoding comprising:
- an outer soft-input-soft-output (SISO) decoder capable of processing soft channel metrics relating to data received from a channel;
- an interleaver coupled to the outer SISO decoder;
- a deinterleaver coupled to the outer SISO decoder;
- a logical unit SISO decoder coupled to the interleaver and the deinterleaver; and
- an inner SISO decoder coupled to the logical unit SISO decoder;
- wherein the outer SISO decoder, the interleaver, the deinterleaver, the logical unit SISO decoder, and the inner SISO decoder are capable of operating to decode the soft channel metrics to produce decoded soft outputs;
- wherein the logical unit SISO decoder in an outer SISO decoder direction is capable of receiving a first number of soft inputs and produces a corresponding second number of soft outputs, the second number being less than the first number;
- wherein the logical unit SISO decoder in an inner SISO decoder direction is capable of receiving the second number of soft inputs and produces a corresponding first number of soft outputs.

26. The apparatus of claim 25 wherein the logical unit SISO decoder corresponds to an encoder logical unit that receives the first number of input bits and produces the second number of corresponding output bits, wherein the encoder logical unit takes each of the first number of input bits into account in producing the second number of output bits.

27. The apparatus of claim 25 wherein the logical unit SISO decoder performs a single parity check decoding operation.

28. The apparatus of claim 25 wherein the first number is variable to allow change in an overall coding rate.

29. The apparatus of claim 25 wherein the second number has a fixed value of 1.

30. A system for performing data encoding comprising:
- means for encoding data bits according to an outer convolutional code to produce outer encoded bits;
- means for processing the outer encoded bits-to produce intermediate bits, wherein the number of intermediate bits is less than the number of outer encoded bits;
- means for encoding the intermediate bits according to an inner convolutional code to produce inner encoded bits, wherein the inner convolutional code is characterized by at least two states; and
- means for combining the data bits and the inner encoded bits to produce encoded outputs.

31. A system for performing data decoding comprising:
- means for obtaining soft channel metrics relating to data received from a channel; and
- means for decoding the soft channel metrics,
- wherein the means for decoding the soft channel metrics includes in an outer SISO decoder direction receiving a first number of soft inputs and producing a corresponding second number of soft outputs, the second number being less than the first number; and
- wherein the means for decoding the soft channel metrics includes in an inner SISO decoder direction receiving the second number of soft inputs and producing a corresponding first number of soft outputs.

* * * * *